(12) United States Patent
Fujii et al.

(10) Patent No.: US 8,423,868 B2
(45) Date of Patent: Apr. 16, 2013

(54) METHOD FOR CORRECTING HIGH-FREQUENCY CHARACTERISTIC ERROR OF ELECTRONIC COMPONENT

(75) Inventors: Naoki Fujii, Oumihachiman (JP); Gaku Kamitani, Kyoto (JP); Taichi Mori, Yasu (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 973 days.

(21) Appl. No.: 12/474,389

(22) Filed: May 29, 2009

(65) Prior Publication Data

US 2010/0017669 A1    Jan. 21, 2010

Related U.S. Application Data

(63) Continuation of application No. PCT/JP2007/067378, filed on Sep. 6, 2007, and a continuation of application No. PCT/JP2007/073110, filed on Nov. 29, 2007.

(30) Foreign Application Priority Data

Nov. 30, 2006    (JP) ................................. 2006-324975

(51) Int. Cl.
*H03M 13/00*    (2006.01)
(52) U.S. Cl.
USPC ......................................................... 714/774
(58) Field of Classification Search .................... 714/774
See application file for complete search history.

(56) References Cited

U.S. PATENT DOCUMENTS

| | | | |
|---|---|---|---|
| 5,748,000 A | 5/1998 | Blackham | |
| 6,614,237 B2 | 9/2003 | Ademian et al. | |
| 6,697,749 B2 | 2/2004 | Kamitani | |
| 6,826,506 B2 | 11/2004 | Adamian et al. | |
| 6,828,506 B2 | 12/2004 | Murakami | |
| 6,920,407 B2 | 7/2005 | Adamian et al. | |
| 7,865,177 B2 * | 1/2011 | Sorrells et al. | ................ 455/413 |

(Continued)

FOREIGN PATENT DOCUMENTS

| | | |
|---|---|---|
| JP | 10-82808 | 3/1998 |
| JP | 2003-240827 | 8/2003 |

(Continued)

OTHER PUBLICATIONS

Agilent AN 1287-9 In Fixture Measurement Using Vector Network Analyzers, Agilent Technologies, Inc. Aug. 2000.

(Continued)

*Primary Examiner* — Albert Decady
*Assistant Examiner* — Enam Ahmed
(74) *Attorney, Agent, or Firm* — Dickstein Shapiro LLP

(57) ABSTRACT

An electronic-component high-frequency characteristic error correcting method for allowing a calibration work to be performed on a two-terminal impedance component using the same correction-target measuring system as that used in actual measurement. At least three correction data acquisition samples having different high-frequency characteristics are measured by a reference measuring system and an actual measuring system. An equation for associating the value measured by the actual measuring system with the value measured by the reference measuring system using an error correction coefficient of a transmission line is determined. A given electronic component is measured by the actual measuring system. An estimated high-frequency characteristic value of the electronic component obtained when the electronic component is measured by the reference measuring system is calculated using the determined equation.

8 Claims, 20 Drawing Sheets

U.S. PATENT DOCUMENTS

| | | | | |
|---|---|---|---|---|
| 7,995,490 | B2 * | 8/2011 | Bailey et al. | 370/252 |
| 8,340,618 | B2 * | 12/2012 | Sorrells et al. | 455/313 |
| 2003/0120449 | A1 | 6/2003 | Kamitani | |
| 2004/0059529 | A1 | 3/2004 | Kamitani | |
| 2007/0241760 | A1 | 10/2007 | Yamasaki | |

FOREIGN PATENT DOCUMENTS

| | | |
|---|---|---|
| JP | 2006-242799 | 9/2006 |
| JP | 2006-300928 | 11/2006 |
| WO | WO-2005/101033 | 10/2005 |
| WO | WO-2006/030547 | 3/2006 |
| WO | WO 2006-090550 | 8/2006 |

OTHER PUBLICATIONS

PCT/JP2007/067378 International Search Report dated Nov. 10, 2007.

PCT/JP2007/067378 Written Opinion dated Nov. 10, 2007.

PCT/JP2007/073110 International Search Report dated Feb. 13, 2008.

PCT/JP2007/073110 Written Opinion dated Feb. 13, 2008.

Silvonen, K.; "Calibration of Test Tixtures Using at Least Two Standards", IEEE Transactions on Microwave Theory and Techniques, vol. 39, No. 4, Apr. 1991, pp. 624-630.

* cited by examiner

— REFERENCE VALUE
--- BEFORE CORRECTION
······ AFTER CORRECTION

- - - REFERENCE VALUE
——— BEFORE CORRECTION
·········· AFTER CORRECTION

METHOD FOR CORRECTING HIGH-FREQUENCY CHARACTERISTIC ERROR OF ELECTRONIC COMPONENT

CROSS REFERENCE TO RELATED APPLICATIONS

The present application is a continuation of International Application No. PCT/JP2007/073110, filed Nov. 29, 2007, which claims priority to International Application No. PCT/JP2007/067378, filed Sep. 6, 2007, which both claim priority to Japanese Patent Application No. JP2006-324975, filed Nov. 30, 2006, the entire contents of each of these applications being incorporated herein by reference in their entirety.

FIELD OF THE INVENTION

The present invention relates to methods for correcting high-frequency characteristic errors of electronic components, and more specifically, to a method for correcting an error of a measuring system in measurement of a high-frequency characteristic of a two-terminal impedance component.

BACKGROUND OF THE INVENTION

Conventionally, electrical characteristics of electronic components are measured using an automatic characteristic selector in an electronic-component mass-production process. Since a measuring system of the automatic characteristic selector has a circuit characteristic different from a reference measuring system, it is possible to improve a yield by correcting a value measured by the automatic characteristic selector to estimate a value measured by the reference measuring system. Techniques, such as SOLT calibration, TRL calibration, and RRRR/TRRR calibration, are known as such a correction method.

First, TRL/SOLT calibration will be described.

The TRL calibration is the most effective conventional technique that can be used to measure a true value of a scattering coefficient matrix of a measurement-subject surface mount device. In addition, the SOLT calibration is known as a widely used conventional technique. These will be briefly described.

To obtain a true value of the measurement subject, an error factor of a measuring system has to be identified and an influence of the error factor has to be removed from a measurement result. FIG. 1 shows an error model used in a representative error removal method (calibration method).

More specifically, as shown in FIG. 1(a), a subject electronic component 2 is connected to a transmission line formed on an upper face of a fixture 10. Connectors 51 and 61 provided at one end of coaxial cables 50 an 60 are connected to connectors 11a and 11b provided at respective ends of the transmission line of the fixture 10, respectively. The other ends of the coaxial cables 50 and 60 are connected to measurement ports of a network analyzer, not shown. Arrows 51a and 61s show calibration planes.

FIG. 1(b) shows an error model of the TRL correction. A circuit 52 on one measurement-port side represented by scattering coefficients $e_{00}$, $e_{01}$, $e_{10}$, and $e_{11}$ and a circuit 62 on the other measurement-port side represented by scattering coefficients $f_{00}$, $f_{01}$, $f_{10}$, and $f_{11}$, are connected between a circuit 12 of the fixture represented by scattering coefficients $S_{11A}$, $S_{12A}$, $S_{21A}$, and $S_{22A}$ and pairs of terminals $a_1$-$b_1$ and $a_2$-$b_2$.

FIG. 1(c) shows an error model of the SOLT correction. A circuit 54 on one measurement-port side represented by scattering coefficients $E_{DF}$, $E_{RF}$, 1, $E_{SF}$ and a circuit 64 on the other measurement-port side represented by scattering coefficients $E_{LF}$ and $E_{TF}$ are connected to respective sides of a circuit 14 of the fixture represented by scattering coefficients $S_{11A}$, $S_{12A}$, $S_{21A}$, and $S_{22A}$.

To identify an error factor in the SOLT calibration, measurement has to be carried out for at least three kinds of devices having known scattering coefficients mounted on a subject measuring plane. As shown in FIG. 2, traditionally, opened (open), short-circuited (short), and terminated (load=50Ω) standards 80, 81, and 82 are often used. Since it is extremely difficult to realize preferable "opened" and "terminated" standards except for in a coaxial environment, calibration cannot be performed at ends of the fixture 10 (calibration planes shown by the arrows 51s and 61s). Since such standards can be realized by a method, such as sliding load, in the coaxial environment, this method is widely used and is referred to as the SOLT calibration.

The TRL calibration uses, instead of the hard-to-realize device-form standards, port-directly-connected state (through), total reflection (reflection, generally short-circuited), and several kinds of transmission lines (lines) having different length as standards. Since manufacture of the transmission lines of the standards having known scattering coefficients is relatively easy and characteristics of the total reflection can be predicted relatively easily if the total reflection is realized by short-circuit, the TRL calibration is known as the most accurate calibration method used in, particularly, a waveguide environment.

FIG. 3 shows an error-factor determining method of the TRL calibration. In the drawing, shading is attached to transmission lines. As indicated by arrows 2s and 2t, calibration planes are parts connected to devices. To identify an error factor, a board 86 of the port-directly-connected state (through), a board 83 of the total reflection (reflection, generally, short-circuited), and boards 84 and 85 of the several kinds of transmission lines (lines) having different lengths are used as standards. In this example, "through" indicates so-called "zero-through". At the time of measurement of a subject, measurement is carried out after a subject 2 is series-connected to a measurement board 87, which is extended by the size of the subject.

The abstract of the TRL and SOLT calibration is as described above. These techniques have following two problems.

(1) A calibration error is caused unless all error factors caused at connection parts of coaxial-planer transmission lines are equal in transmission lines (several kinds of lines and reflection) and "through" serving as the standards. Even if the same kind of connectors are used in each of the standards, an influence of a connector characteristic variance becomes significantly large when the error factor of each connector differs, and thus, it is substantially impossible to carry out calibration as the frequency approaches the millimeter waveband.

(2) To solve the above-described problem, available fixtures are improved to avoid the influence of the connector measurement variance by connecting a common coaxial connector to a standard transmission line with a contact. However, it is structurally difficult to guarantee a sufficient pressing load applied to the contact part since a coaxial pin may be damaged, and calibration often becomes unstable due to the unstable contact. In addition, since the transmission lines and the coaxial pin generally become thinner as a measurement frequency becomes higher, a measurement variance increases due to reproducibility of positioning of these elements.

To solve these problems, so-called RRRR/TRRR calibration methods have been proposed.

An abstract of the RRRR/TRRR calibration methods will be described next.

These methods are characterized to identify a measuring system error up to ends of a transmission line by short-circuiting a signal conductor and a ground conductor at several predetermined positions of a single transmission line and to be able to highly accurately measure a high-frequency electrical characteristic of a surface mount device. These methods are advantageously free from the problems regarding the transmission-line characteristic variance and the variance of the connection state of the transmission lines and the coaxial connectors involving the TRL/SOLT calibration methods.

As shown in FIG. 4 and FIG. 5, error models are similar to those of the SOLT/TRL calibration. More specifically, FIG. 4 shows an error model of the TRRR calibration, which is the same as the error model of the SOLT calibration shown in FIG. 1(c). FIG. 5 shows an error model of the RRRR calibration, which is the same as the error model of the TRL calibration shown in FIG. 1(b).

A characteristic of the RRRR/TRRR calibration methods is a method for measuring a "standard measurement value" used in calibration. The SOLT and the TRL use measurement values of a standard device and a standard transmission line as the "standard measurement value", respectively. As shown in FIG. 6, the RRRR/TRRR calibration methods use values measured by changing a short-circuited reference position on a measurement board 10a as the "standard measurement value". Since an influence of connectors is not caused, the RRRR/TRRR calibration methods are more accurate and more effective than the SOLT calibration and the TRL calibration in desktop measurement.

However, since the TRRR/RRRR calibration uses a change in reflection coefficients resulting from different connection positions of a short-circuited reference (short chip 2s) to fixture transmission lines 10s and 10t as the calibration reference, the connection position of the short-circuited reference has to be significantly changed when a wavelength of a signal to be measured is long (frequency is low) and, thus, $T_1$ and $T_2$ shown in the drawing have to be extended. Accordingly, a length of the measurement board 10a (size in a direction indicated by an arrow L) has to be extended. In addition, since an automatic characteristic selector used in a mass-production process has a restriction regarding the structure and size, it is difficult to provide a correction ground terminal in the fixture 10a and to configure the short chip 2s so that the position thereof can be determined accurately (see, for example, Patent Documents 1 and 2).

Patent Document 1: WO2005/101033
Patent Document 2: WO2005/101034
Non-Patent Document 1: Application Note 1287-9: In-Fixture Measurements Using Vector Network Analyzers, (© 1999 Hewlett-Packard Company)

SUMMARY OF THE INVENTION

For example, as shown in a major configuration diagram of FIG. 9, electrodes 2a and 2b of a subject electronic component 2 are pressed onto measurement pins 32a and 32b protruding from a measurement terminal section 30 so as to be connected to the measurement pins 32a and 32b in series and the measurement pins 32a and 32b are connected to a measuring device, not shown, through coaxial cables 34 and 35, respectively, in an automatic characteristic selector used in an electronic-component mass-production process. When only a narrow space that permits connection of the electronic component 2 can be acquired around the measurement terminal section 30, correction of a measuring system error has to be performed under a restriction that only mass-produced devices or samples having the size/shape substantially the same as the mass-produced devices can be substantially connected to the measurement terminal section 30. In such a case, following problems are caused.

(1) It is impossible to connect transmission lines having different lengths to the measurement terminal section of the automatic characteristic selector and the TRL calibration cannot be employed.

(2) The SOLT calibration cannot be performed at ends of the measurement terminal section in practice and has a restriction that the SOLT calibration can be applied only to coaxial and waveguide systems. Generally, the SOLT calibration is performed on a range up to a coaxial connector section and the following transmission lines are designed not to cause an error, whereby sufficient measurement accuracy is obtained. However, since the restriction regarding the shape and size is applied to the transmission lines following the coaxial connectors in the measurement terminal section of the automatic characteristic selector, sufficient accuracy is not often obtained only by calibration of a range up to the coaxial connector section.

(3) Even if measurement of a standard device is attempted at the ends of the measurement terminal section by improving the SOLT calibration, following problems are caused.

i) The SOLT calibration requires measurement of a one-port device at each port. More specifically, when a two-terminal electronic component is series-connected between a slit 10k of a single signal line 10x as shown by a plan view of a measurement board 10b in FIG. 7 and is measured, a ground terminal is not provided at a terminal section since the ground terminal is not necessary for measurement. However, since the one-port device cannot be measured without the ground conductor in the SOLT calibration, the ground terminal has to be provided only for calibration to employ the SOLT calibration.

ii) Measurement of three kinds of one-port devices having known values is required at each of two ports in the SOLT calibration. However, since two terminals of the device are connected between a signal conductor 10p and a ground conductor 10g as shown by a plan view of a measurement board 10c in FIG. 8, it is impossible to independently measure a one-port device.

(4) When a series-connected two-terminal electronic component is measured, a ground terminal is not provided at a terminal section since the ground terminal is not necessary for measurement. However, since measurement has to be performed in a short-circuited state in the RRRR calibration, a ground terminal has to be provided only for calibration to employ the RRRR calibration.

(5) Although measurement is performed by short-circuiting several positions of a board in the RRRR calibration, a connection position of the short-circuited reference has to be changed significantly when a frequency is low. Accordingly, the length of the measurement board has to be extended.

In view of such a circumstance, the present invention is to provide an electronic-component high-frequency characteristic error correcting method that permits a calibration work to be carried out on a two-terminal impedance component using the same correction-target measuring system as that used in actual measurement.

Means for Solving the Problems

To solve the above-described problems, the present invention provides an electronic-component high-frequency characteristic error correcting method configured in the following manner.

An electronic-component high-frequency characteristic error correcting method is a method for calculating, on the basis of a result obtained by measuring a two-terminal impedance electronic component by an actual measuring system, an estimated high-frequency characteristic value of the electronic component that may be obtained when the electronic component is measured by a reference measuring system. The electronic-component high-frequency characteristic error correcting method includes (1) a first step of preparing at least three first correction data acquisition samples having different high-frequency characteristics, values of the samples being identified by the reference measuring system, (2) a second step of measuring the at least three first correction data acquisition samples or at least three second correction data acquisition samples that can be considered to have high-frequency characteristics equivalent to the first correction data acquisition samples by the actual measuring system, (3) a third step of determining an equation that associates a value measured by the actual measuring system with a value measured by the reference measuring system using an error correction coefficient of a transmission line on the basis of the data of the first correction data acquisition samples prepared at the first step identified by the reference measuring system and the data of the first correction data acquisition samples or the second correction data acquisition samples measured by the actual measuring system at the second step, (4) a fourth step of measuring a given electronic component by the actual measuring system, and (5) a fifth step of calculating, using the equation determined at the third step, an estimated high-frequency characteristic value of the electronic component that may be obtained when the electronic component is measured by the reference measuring system on the basis of the measured result obtained at the fourth step.

The values of the first correction data acquisition samples prepared at the first step may be previously identified by actually measuring the samples by the reference measuring system or may be previously identified using other methods. For example, only some of many samples that can be considered to have equivalent characteristics may be actually measured by the reference measuring system and the measured values may be used for identification of the other samples.

According to the above-described method, it is possible to execute the first and second steps using correction data acquisition samples having the shape/size that are substantially the same as those of an electronic component. Conventionally, a measuring system of an automatic characteristic selector can calibrate only a range up to an end of a coaxial connector. However, the above-described method permits correction to be performed on a range up to an end of a terminal section to which the electronic component is connected.

In a preferable embodiment, the first correction data acquisition sample and the electronic component or the first correction data acquisition sample, the second correction data acquisition sample, and the electronic component are series-connected in the actual measuring system. The equation is determined on the basis of error models that are connected between terminals $1_m$ and $2_m$ where impedance $Z_m$ of the electronic component is measured by the reference measuring system and terminals $1_d$ and $2_d$ where impedance $Z_d$ of the electronic component is measured by the actual measuring system, respectively. When impedance viewed from the terminal $1_m$ is calculated, impedance $Z_{11}$ and $Z_f$ are connected between the terminal $1_m$ and the terminal $1_d$ in series, impedance $Z_{12}$ is connected between ground and a connection point of the impedance $Z_{11}$ and $Z_f$, impedance $Z_{21}$ is connected between the terminal $2_d$ and the terminal $2_m$, and impedance $Z_{22}$ is connected between the terminal $2_d$ and ground in the error models. The impedance $Z_f$, $Z_{11}$, $Z_{12}$, $Z_{21}$, and $Z_{22}$ are determined using at least one combination that gives matching $Z_{f1}$, $Z_{f2}$, and $Z_{f3}$ regarding a following equation [Equation 2]

$$Z_{f1} = -\frac{\begin{bmatrix} \left\{\begin{array}{c}(Z_{22}+(Z_{21}+Z_0))Z_{d1}+ \\ ((Z_{21}+Z_0)+Z_{12})Z_{22}+ \\ Z_{12}(Z_{21}+Z_0)\end{array}\right\}Z_{m11}+ \\ \left\{\begin{array}{c}(-Z_{12}-Z_{11})Z_{22}+ \\ (-Z_{12}-Z_{11})(Z_{21}+Z_0)\end{array}\right\}Z_{d1}+ \\ \left\{\begin{array}{c}(-Z_{12}-Z_{11}) \\ (Z_{21}+Z_0)-Z_{11}Z_{12}\end{array}\right\}Z_{22} - \\ Z_{11}Z_{12}(Z_{21}+Z_0)\end{bmatrix}}{\begin{bmatrix}\{(Z_{22}+(Z_{21}+Z_0)\}Z_{m11}+ \\ (-Z_{12}-Z_{11})Z_{22}+ \\ (-Z_{12}-Z_{11})(Z_{21}+Z_0)\end{bmatrix}}$$

$$Z_{f2} = -\frac{\begin{bmatrix} \left\{\begin{array}{c}(Z_{22}+(Z_{21}+Z_0))Z_{d2}+ \\ ((Z_{21}+Z_0)+Z_{12})Z_{22}+ \\ Z_{12}(Z_{21}+Z_0)\end{array}\right\}Z_{m12}+ \\ \left\{\begin{array}{c}(-Z_{12}-Z_{11})Z_{22}+ \\ (-Z_{12}-Z_{11})(Z_{21}+Z_0)\end{array}\right\}Z_{d2}+ \\ \{(-Z_{12}-Z_{11})(Z_{21}+Z_0)-Z_{11}Z_{12}\} \\ Z_{22}-Z_{11}Z_{12}(Z_{21}+Z_0)\end{bmatrix}}{\begin{bmatrix}\{(Z_{22}+(Z_{21}+Z_0)\}Z_{m12}+ \\ (-Z_{12}-Z_{11})Z_{22}+ \\ (-Z_{12}-Z_{11})(Z_{21}+Z_0)\end{bmatrix}}$$

$$Z_{f3} = -\frac{\begin{bmatrix} \left\{\begin{array}{c}(Z_{22}+(Z_{21}+Z_0))Z_{d3}+ \\ ((Z_{21}+Z_0)+Z_{12})Z_{22}+ \\ Z_{12}(Z_{21}+Z_0)\end{array}\right\}Z_{m13}+ \\ \left\{\begin{array}{c}(-Z_{12}-Z_{11})Z_{22}+ \\ (-Z_{12}-Z_{11})(Z_{21}+Z_0)\end{array}\right\}Z_{d3}+ \\ \{(-Z_{12}-Z_{11})(Z_{21}+Z_0)-Z_{11}Z_{12}\}Z_{22}- \\ Z_{11}Z_{12}(Z_{21}+Z_0)\end{bmatrix}}{\begin{bmatrix}\{(Z_{22}+(Z_{21}+Z_0)\}Z_{m13}+ \\ (-Z_{12}-Z_{11})Z_{22}+(-Z_{12}-Z_{11}) \\ (Z_{21}+Z_0)\end{bmatrix}}$$

among 16 combinations of $Z_{11}$, $Z_{12}$, $Z_{21}$, and $Z_{22}$ obtained on the basis of a following equation [Equation 1a]

$$denom =$$

$$(Z_{d2}-Z_{d1})Z_{m13}+(Z_{d1}-Z_{d3})Z_{m12}+(Z_{d3}-Z_{d2})Z_{m11}$$

and $$Z_{11} = \frac{\begin{bmatrix}\pm\sqrt{Z_{d2}-Z_{d1}}\sqrt{Z_{d3}-Z_{d1}}\sqrt{Z_{d3}-Z_{d2}} \\ \sqrt{Z_{m12}-Z_{m11}}\sqrt{Z_{m13}-Z_{m11}}\sqrt{Z_{m13}-Z_{m12}} - \\ \left\{\begin{array}{c}(Z_{d3}-Z_{d2})Z_{m12}Z_{m13}+ \\ (Z_{d1}-Z_{d3})Z_{m11}Z_{m13}+ \\ (Z_{d2}-Z_{d1})Z_{m11}Z_{m12}+\end{array}\right\}\end{bmatrix}}{denom}$$

$$Z_{12} = \frac{\pm\sqrt{(Z_{d2}-Z_{d1})\left(\begin{array}{c}Z_{d3}^2+(-Z_{d2}-Z_{d1})Z_{d3}+ \\ Z_{d1}Z_{d2}\end{array}\right)}}{denom}\sqrt{(Z_{m12}-Z_{m11})\left(\begin{array}{c}Z_{m13}^2+(-Z_{m2}-Z_{m11})Z_{m13} \\ +Z_{m11}Z_{m12}\end{array}\right)}$$

a following equation [Equation 1b]

$$denom = (Z_{d2} - Z_{d1})Z_{m23} + (Z_{d1} - Z_{d3})Z_{m22} + (Z_{d3} - Z_{d2})Z_{m21}$$

[Equation 1b]

$$Z_{21} = \frac{\pm\sqrt{Z_{d2}-Z_{d1}}\sqrt{Z_{d3}-Z_{d1}}\sqrt{Z_{d3}-Z_{d2}} \atop \sqrt{Z_{m22}-Z_{d21}}\sqrt{Z_{m23}-Z_{m21}}\sqrt{Z_{m23}-Z_{m22}} - \left\{\begin{array}{l}(Z_{d3}-Z_{d2})Z_{m22}Z_{m23}+\\(Z_{d1}-Z_{d3})Z_{m21}Z_{m23}+\\(Z_{d2}-Z_{d1})Z_{m21}Z_{m22}+\end{array}\right\}}{denom}$$

$$Z_{22} = \frac{\pm\sqrt{(Z_{d2}-Z_{d1})(Z_{d3}^2 + (-Z_{d2}-Z_{d1})Z_{d3}+Z_{d1}Z_{d2}) \atop (Z_{m22}-Z_{m21})\left(\begin{array}{l}Z_{m23}^2+(-Z_{m22}-Z_{m21})Z_{m23}+\\Z_{m21}Z_{m22}\end{array}\right)}}{denom}$$

using results $Z_{d1}$, $Z_{d2}$, and $Z_{d3}$ obtained by measuring impedance of the at least three first correction data acquisition samples at the first step, and results $Z_{m11}$, $Z_{m12}$, and $Z_{m13}$ obtained by measuring impedance of the terminal $1_m$ and results $Z_{m21}$, $Z_{m22}$, and $Z_{m23}$ obtained by measuring impedance of the terminal $2_m$ regarding the at least three first correction data acquisition samples or the second correction data acquisition samples at the second step.

In this case, a measurement result in the reference measuring system can be estimated by correcting an error of a transmission line regarding the measured result of the series-connected actual measuring system.

In another preferable embodiment, the first correction data acquisition sample and the electronic component or the first correction data acquisition sample, the second correction data acquisition sample, and the electronic component are shunt-connected in the actual measuring system. The equation is determined on the basis of error models that are connected between terminals $1_m$ and $2_m$ where admittance $Y_m$ of the electronic component is measured by the reference measuring system and terminals $1_d$ and $2_d$ where admittance $Y_d$ of the electronic component is measured by the actual measuring system, respectively. When admittance viewed from the terminal $1_m$ is calculated, admittance $Y_{12}$ is connected between the terminal $1_m$ and the terminal $1_d$, admittance $Y_{11}$ is connected between ground and a connection point of the terminal $1_m$ and the admittance $Y_{12}$, admittance $Y_f$ is connected between ground and a connection point of the admittance $Y_{12}$ and the terminal $1_d$, admittance $Y_{22}$ is connected between the terminal $2_d$ and the terminal $2_m$, and admittance $Y_{21}$ is connected between ground and a connection point of the admittance $Y_{22}$ and the terminal $2_m$ in the error models. The admittance $Y_f$, $Y_{11}$, $Y_{12}$, $Y_{21}$, and $Y_{22}$ are determined using at least one combination that gives matching $Y_{f1}$, $Y_{f2}$, and $Y_{f3}$ regarding a following equation [Equation 4]

$$Y_{f1} = -[\{(Y_{22}+(Y_{21}+Y_0))Y_{d1}+$$

[Equation 4]

$$((Y_{21}+Y_0)+Y_{12})Y_{22}+Y_{12}(Y_{21}+Y_0)\}Y_{m11}+$$

$$\{(-Y_{12}-Y_{11})Y_{22}+(-Y_{12}-Y_{11})(Y_{21}+Y_0)\}Y_{d1}+$$

$$\{(-Y_{12}-Y_{11})(Y_{21}+Y_0)-Y_{11}Y_{12}\}Y_{22}-$$

$$Y_{11}Y_{12}(Y_{21}+Y_0)]/[\{(Y_{22}+(Y_{21}+Y_0))\}Y_{m11}+$$

$$(-Y_{12}-Y_{11})Y_{22}+(-Y_{12}-Y_{11})(Y_{21}+Y_0)]$$

-continued
$$Y_{f2} = -[\{(Y_{22}+(Y_{21}+Y_0))Y_{d2}+((Y_{21}+Y_0)+Y_{12})Y_{22}+$$

$$Y_{12}(Y_{21}+Y_0)\}Y_{m12}+$$

$$\{(-Y_{12}-Y_{11})Y_{22}+(-Y_{12}-Y_{11})(Y_{21}+Y_0)\}Y_{d2}+$$

$$\{(-Y_{12}-Y_{11})(Y_{21}+Y_0)-Y_{11}Y_{12}\}Y_{22}-$$

$$Y_{11}Y_{12}(Y_{21}+Y_0)]/[\{(Y_{22}+(Y_{21}+Y_0))\}Y_{m12}+$$

$$(-Y_{12}-Y_{11})Y_{22}+(-Y_{12}-Y_{11})(Y_{21}+Y_0)]$$

$$Y_{f3} = -[\{(Y_{22}+(Y_{21}+Y_0))Y_{d3}+((Y_{21}+Y_0)+Y_{12})Y_{22}+$$

$$Y_{12}(Y_{21}+Y_0)\}Y_{m13}+$$

$$\{(-Y_{12}-Y_{11})Y_{22}+(-Y_{12}-Y_{11})(Y_{21}+Y_0)\}$$

$$Y_{d3}+\{(-Y_{12}-Y_{11})(Y_{21}+Y_0)-Y_{11}Y_{12}\}Y_{22}-$$

$$Y_{11}Y_{12}(Y_{21}+Y_0)]/[\{(Y_{22}+(Y_{21}+Y_0))\}Y_{m13}+$$

$$(-Y_{12}-Y_{11})Y_{22}+(-Y_{12}-Y_{11})(Y_{21}+Y_0)]$$

among 16 combinations of $Y_{11}$, $Y_{12}$, $Y_{21}$, and $Y_{22}$ obtained on the basis of a following equation [Equation 3a]

[Equation 3a]

and $denom = (Y_{d2}-Y_{d1})Y_{m13} + (Y_{d1}-Y_{d3})Y_{m12} + (Y_{d3}-Y_{d2})Y_{m11}$ $$Y_{11} = \pm\left[\begin{array}{l}\pm\sqrt{Y_{d2}Y_{d1}}\sqrt{Y_{d3}-Y_{d1}}\sqrt{Y_{d3}-Y_{d2}} \\ \sqrt{Y_{m12}-Y_{m11}}\sqrt{Y_{m13}-Y_{m11}}\sqrt{Y_{m13}-Y_{m12}} - \\ \left\{\begin{array}{l}(Y_{d3}-Y_{d2})Y_{m12}Y_{m13}+\\(Y_{d1}-Y_{d3})Y_{m11}Y_{m13}+\\(Y_{d2}-Y_{d1})Y_{m11}Y_{m12}\end{array}\right\}\end{array}\right]\Big/ denom$$

$$Y_{12} = \pm\sqrt{\frac{(Y_{d2}-Y_{d1})}{(Y_{d3}^2+(-Y_{d2}-Y_{d1})Y_{d3}+Y_{d1}Y_{d2})}}{(Y_{m12}-Y_{m11})} \Big/ denom$$

$$(Y_{m13}^2+(-Y_{m12}-Y_{m11})Y_{m13}+Y_{m11}Y_{m12})$$

a following equation [Equation 3b]

[Equation 3b]

$$denom = (Y_{d2}-Y_{d1})Y_{m23} + (Y_{d1}-Y_{d3})Y_{m22} + (Y_{d3}-Y_{d2})Y_{m21}$$

$$Y_{21} = \left[\begin{array}{l}\pm\sqrt{Y_{d2}-Y_{d1}}\sqrt{Y_{d3}-Y_{d1}}\sqrt{Y_{d3}-Y_{d2}} \\ \sqrt{Y_{m22}-Y_{m21}}\sqrt{Y_{m23}-Y_{m21}}\sqrt{Y_{m23}-Y_{m22}} - \\ \left\{\begin{array}{l}(Y_{d3}-Y_{d2})Y_{m22}Y_{m23}+\\(Y_{d1}-Y_{d3})Y_{m21}Y_{m23}+\\(Y_{d2}-Y_{d1})Y_{m21}Y_{m22}\end{array}\right\}\end{array}\right]\Big/ denom$$

$$Y_{22} = \pm\sqrt{\frac{(Y_{d2}-Y_{d1})(Y_{d3}^2+(-Y_{d2}-Y_{d1})Y_{d3}+Y_{d1}Y_{d2})}{(Y_{m22}-Y_{m21})(Y_{m23}^2+(-Y_{m22}-Y_{m21})Y_{m23}+Y_{m21}Y_{m22})}} \Big/ denom$$

using results $Y_{d1}$, $Y_{d2}$, and $Y_{d3}$ obtained by measuring admittance of the at least three first correction data acquisition samples at the first step, and results $Y_{m11}$, $Y_{m12}$, and $Y_{m13}$ obtained by measuring admittance of the terminal $1_m$ and results $Y_{m21}$, $Y_{m22}$, and $Y_{m23}$ obtained by measuring admittance of the terminal $2_m$ regarding the at least three first correction data acquisition samples or the second correction data acquisition samples at the second step.

In this case, a measurement result in the reference measuring system can be estimated by correcting an error of a transmission line regarding the measured result of the shunt-connected actual measuring system.

When the admittance $Y_{m11}$, $Y_{m12}$, $Y_{m13}$, $Y_{m21}$, $Y_{m22}$, and $Y_{m23}$ of the at least three first correction data acquisition samples or the second correction data acquisition samples are measured in the actual measuring system at the second step, the terminal 1 and terminal 2 may be electrically connected.

In another preferable embodiment, the first correction data acquisition sample and the electronic component or the first correction data acquisition sample, the second correction data acquisition sample, and the electronic component are series-connected in the actual measuring system. The third step includes a sub step of converting the values of the at least three first correction data acquisition samples having the different high-frequency characteristics, prepared at the first step, identified by the reference measuring system and the measured values of the at least three first correction data acquisition samples having different high-frequency characteristics or the at least three second correction data acquisition samples that can be considered to have high-frequency characteristics equivalent to the first correction data acquisition samples obtained in the actual measuring system at the second step into impedance parameters and determining a differential impedance component. The equation associates impedance obtained when the electronic component is measured using two ports of the actual measuring system with impedance obtained when the electronic component is measured in the reference measuring system through a two-port error model, and the equation is determined on the basis of a one-port error model having only one port, to which a differential signal of the two ports is input and where impedance of the electronic component is measured by the reference measuring system.

In this case, the two-port error model is converted with respect to the differential impedance component. An equation regarding a one-port error model is used in the high-frequency characteristic error correction. Since the equation regarding the one-port error model can be uniquely determined from data of the at least three correction data acquisition samples having different high-frequency characteristics obtained in the actual measuring system and the reference measuring system without considering the sign, advantages, such as an improvement of correction accuracy, suppression of an influence of a noise onto the correction accuracy, and simplification of a calculation algorithm, are obtained.

In still another preferable embodiment, the first correction data acquisition sample and the electronic component or the first correction data acquisition sample, the second correction data acquisition sample, and the electronic component are shunt-connected in the actual measuring system. The third step includes a sub step of converting the values of the at least three first correction data acquisition samples having the different high-frequency characteristics, prepared at the first step, identified by the reference measuring system and the measured values of the at least three first correction data acquisition samples having different high-frequency characteristics or the at least three second correction data acquisition samples that can be considered to have high-frequency characteristics equivalent to the first correction data acquisition samples obtained in the actual measuring system at the second step into admittance parameters and determining a common-mode admittance component. The equation associates admittance obtained when the electronic component is measured using two ports of the actual measuring system with admittance obtained when the electronic component is measured in the reference measuring system through a two-port error model, and the equation is determined on the basis of a one-port error model having only one port, to which a common-mode signal of the two ports is input and where admittance of the electronic component is measured by the reference measuring system.

In this case, the two-port error model is converted with respect to the common-mode admittance component. An equation regarding a one-port error model is used in the high-frequency characteristic error correction. Since the equation regarding the one-port error model can be uniquely determined from data of the at least three correction data acquisition samples having different high-frequency characteristics obtained in the actual measuring system and the reference measuring system without considering the sign, advantages, such as an improvement of correction accuracy, suppression of an influence of a noise onto the correction accuracy, and simplification of a calculation algorithm, are obtained.

The present invention also provides an electronic-component high-frequency characteristic error correcting apparatus used in at least the fifth step of the above-described electronic-component high-frequency characteristic error correcting method. The electronic-component high-frequency characteristic error correcting apparatus includes (1) a storage unit for storing the equation determined at the third step and a measured value of a given electronic component obtained in the actual measuring system at the fourth step, and (2) a calculating unit for performing calculation for correcting the measured value stored in the storage unit using the equation stored in the storage unit and calculating an estimated high-frequency characteristic value of the electronic component that may be obtained when the electronic component is measured by the reference measuring system.

According to the present invention, a calibration work can be performed on a two-terminal impedance component using the same correction-target measuring system as that used at the time of actual measurement. As a result, since an automatic characteristic selector not having an effective calibration method can perform selection after performing accurate calibration, accurate measurement selection and characteristic user guarantee of mass-produced devices, which have not been realized, can be realized.

In addition, conventional error correction techniques require a work that is not originally included in measurement, such as removal of a terminal from a connector and connection of a standard device, for error correction. To this end, a ground terminal has to be provided or a structure for pressing a short-circuited reference has to be provided. In contrast, in the method according to the present invention, measurement for correction only has to be performed in the same process as that of general measurement. In addition, the ground terminal and short-circuiting mechanism for correction are not necessary and a terminal section only has to have a function for realizing the general measurement.

Figure 1A:
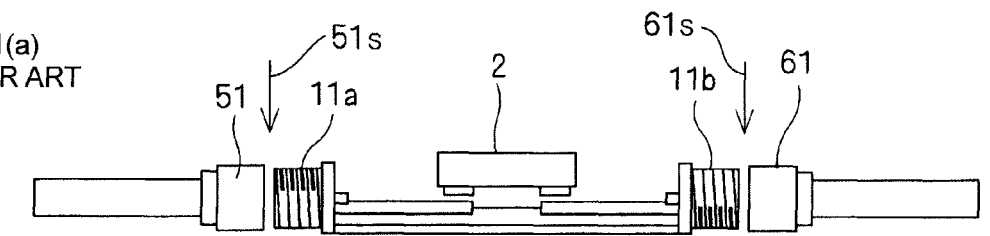
FIGS. 1(a), 1(b), and 1(c) are an explanatory diagram of a measuring system, a circuit diagram of an error model of TRL calibration, and a circuit diagram of an error model of SOLT calibration, respectively.
Figure 1B:
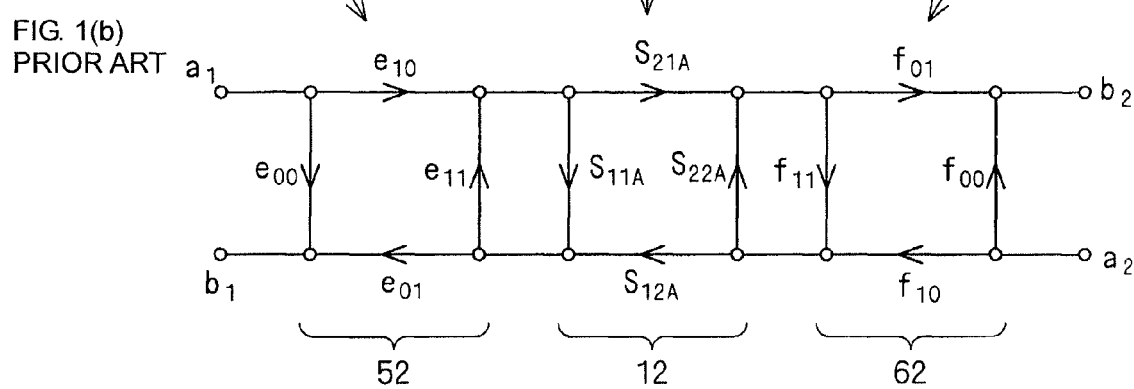
Figure 1C:
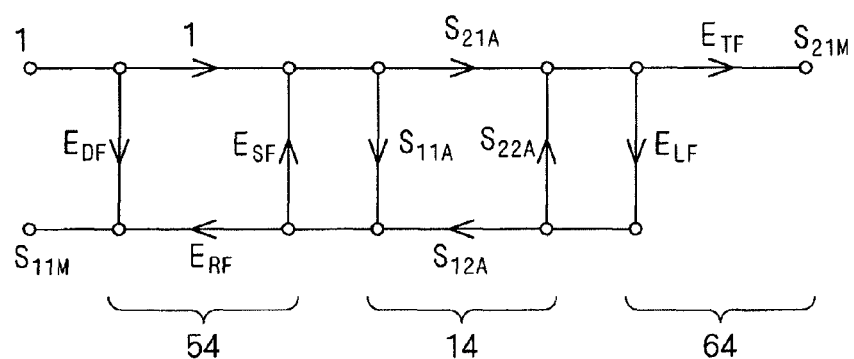
Figure 2:
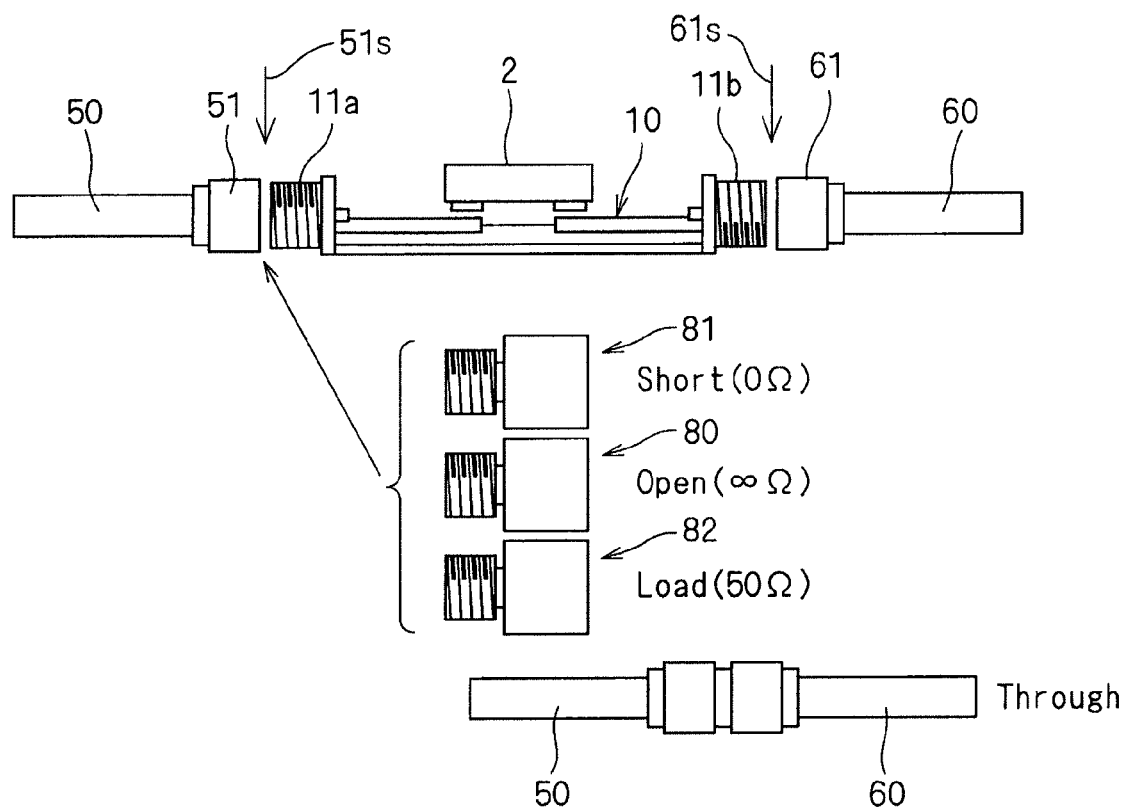
FIG. 2 is an explanatory diagram of an error factor determining method of SOLT calibration (related art).
Figure 3:
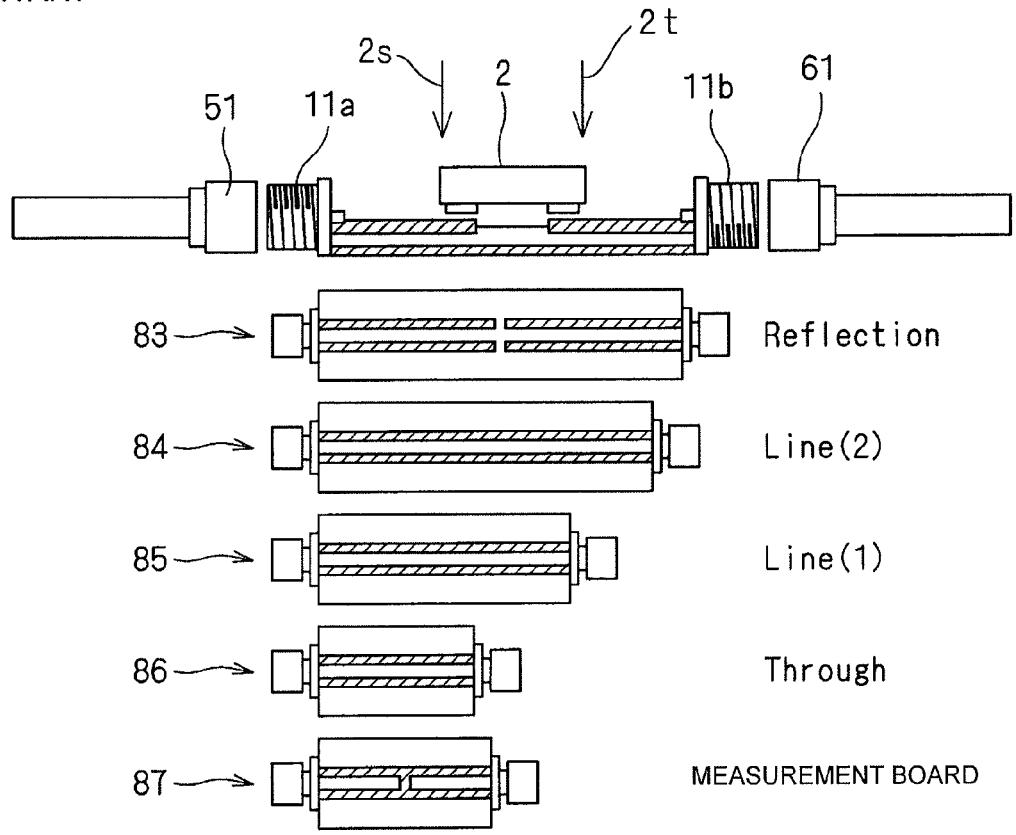
FIG. 3 is an explanatory diagram of an error factor determining method of TRL calibration (related art).
Figure 4:
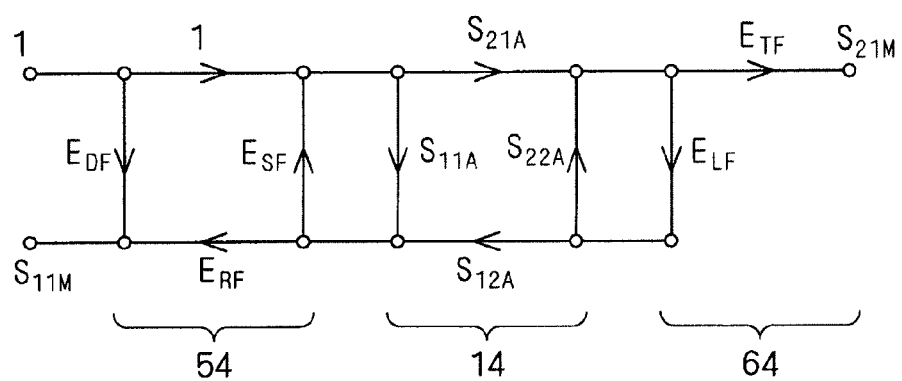
FIG. 4 is a circuit diagram of an error model of TRRR calibration (related art).
Figure 5:
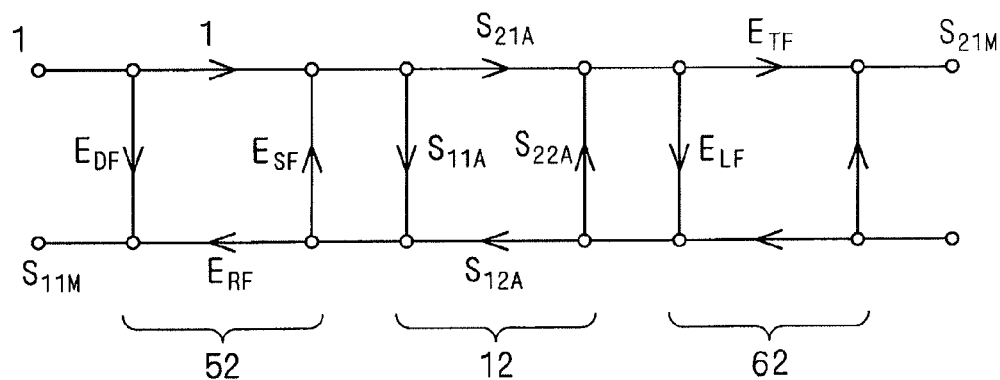
FIG. 5 is a circuit diagram of an error model of RRRR calibration (related art).
Figure 6:
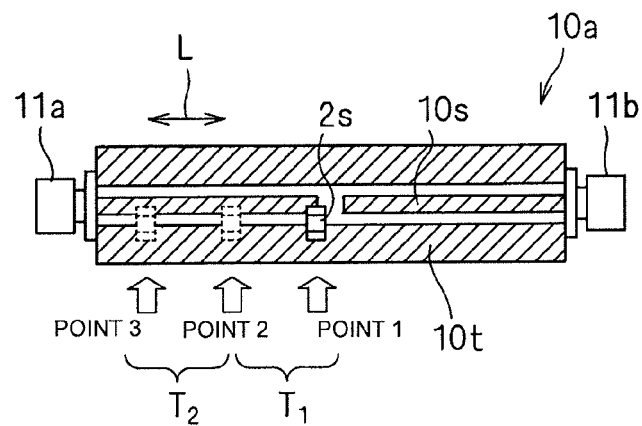
FIG. 6 is an explanatory diagram of a measurement position in TRRR calibration and RRRR calibration (related art).
Figure 7:
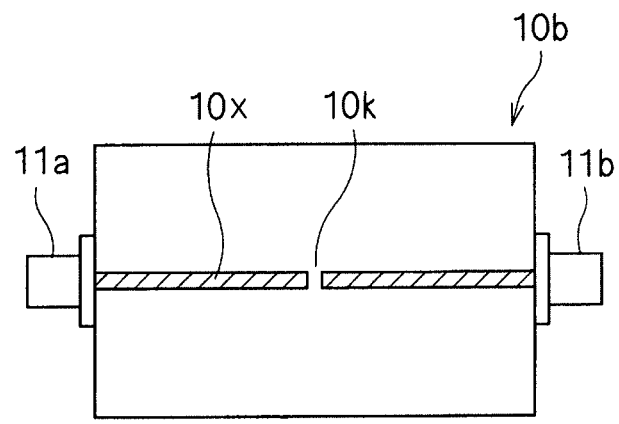
FIG. 7 is a plan view of a series-connected measurement board (related art).
Figure 8:
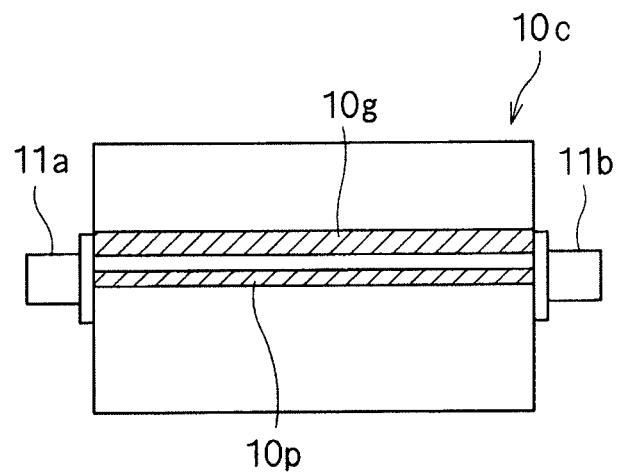
FIG. 8 is a plan view of a shunt-connected measurement board (related art).
Figure 9:
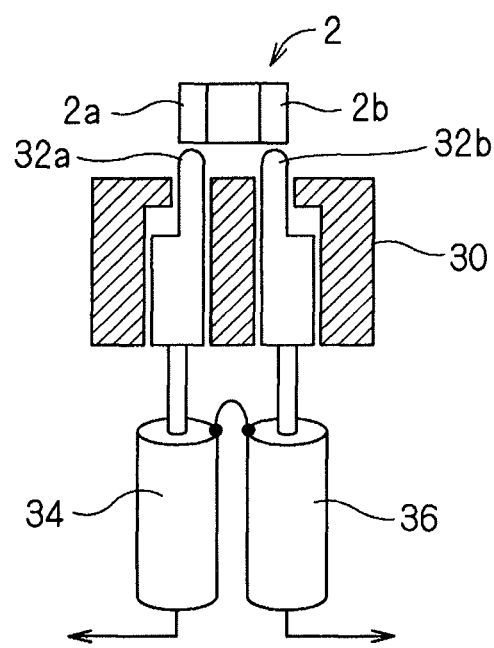
FIG. 9 is a sectional major configuration diagram showing a configuration of a measurement terminal section (related art).

REFERENCE NUMERALS 2 electronic component
20, 21 measurement board
22a, 22b transmission line
26 signal conductor
28 ground conductor

DETAILED DESCRIPTION OF THE INVENTION

Embodiments of the present invention will be described below with reference to FIG. 9 to FIG. 37.

First, a method for correcting a high-frequency characteristic error of an electronic component according to a first-type embodiment of the present invention will be described with reference to FIG. 14 to FIG. 25.

<Principle 1> A measurement-error correction principle applied to a case of series connection will be described with reference to FIG. 14 to FIG. 19.

Figure 14:
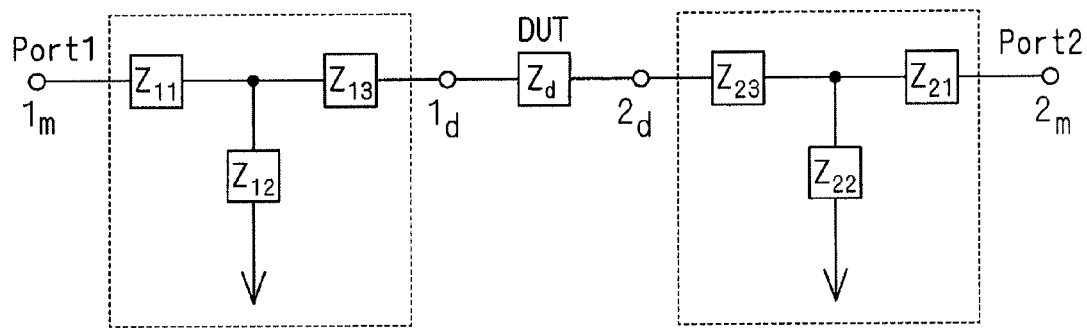
FIG. 14 is a circuit diagram of series-connected error models (embodiment 1).

Although an electrical characteristic of an electronic component is generally represented as a scattering coefficient matrix at frequencies higher than that of a microwave, there is no special reason for representing the electrical characteristic by the scattering coefficient matrix and a convertible easy-to-use parameter may be used in accordance with a purpose. Herein, an impedance T-type connection circuit is adopted as an error parameter of series-measurement of a two-terminal impedance element. FIG. 14 shows an error model thereof. In the drawing, a part enclosed by a dotted line corresponds to an error model of each port. The error models are connected between terminals $1_m$ and $2_m$ at which a subject is measured by a reference measuring system and terminals $1_d$ and $2_d$ at which the subject is measured by a correction-target measuring system. A variable Z represents impedance. In addition, a part represented as DUT is the subject. Since this model represents the series measurement of a two-terminal impedance element, the subject is modeled as a two-terminal impedance element and it is considered that shunt capacitance is ignorable.

Figure 15:
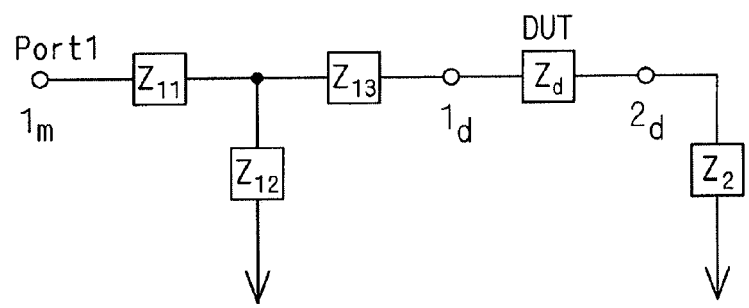
FIG. 15 is a circuit diagram of an equivalent circuit viewed from a port-1 side (embodiment 1).

Since a port 2 simply is terminal impedance when viewed from a port 1, an equivalent circuit shown in FIG. 15 is obtained. Here, $Z_2$ is equivalent impedance of the port 2.

Careful observation of FIG. 15 reveals that $Z_{13}$, $Z_d$, and $Z_2$ are simply connected in series. Accordingly, if $Z_{13}$ and $Z_2$ are collectively shown as $Z_{e1}$, the equivalent circuit can be modified as shown in FIG. 16.

Figure 16:
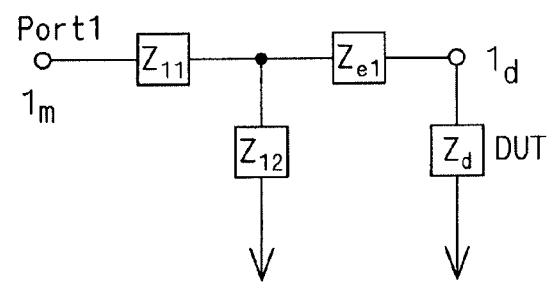
FIG. 16 is a circuit diagram of an equivalent circuit viewed from a port-1 side (embodiment 1).

Since three values $Z_{11}$, $Z_{12}$, and $Z_{e1}$ of an error model shown in FIG. 16 are unknown, these unknown values can be determined if three sets of measurement values $Z_m$ resulting from measurement of correction data acquisition samples $Z_d$ are acquired. More specifically, when three impedance values of the correction data acquisition samples and measured values thereof are denoted as $Z_{d1}$, $Z_{d2}$, and $Z_{3d}$, and $Z_{m11}$, $Z_{m12}$, and $Z_{m13}$, respectively, a relationship represented by the following equation [Equation 5a] is satisfied.

$$Z_{m11} = \frac{(Z_{e1} + Z_{d1})Z_{12}}{Z_{12} + Z_{e1} + Z_{d1}} + Z_{11} \quad \text{[Equation 5a]}$$

$$Z_{m12} = \frac{(Z_{e1} + Z_{d2})Z_{12}}{Z_{12} + Z_{e1} + Z_{d2}} + Z_{11}$$

$$Z_{m13} = \frac{(Z_{e1} + Z_{d3})Z_{12}}{Z_{12} + Z_{e1} + Z_{d3}} + Z_{11}$$

Error factors can be calculated using the following equation [Equation 5b] determined from the equation [Equation 5a]. Which of positive and negative different solutions of the equation to be selected will be described later.

[Equation 5b]

$$denom = (Z_{d2} - Z_{d1})Z_{m13} + (Z_{d1} - Z_{d3})Z_{m12} + (Z_{d3} - Z_{d2})Z_{m11}$$

$$Z_{11} = \begin{bmatrix} \pm\sqrt{Z_{d2}-Z_{d1}}\sqrt{Z_{d3}-Z_{d1}}\sqrt{Z_{d3}-Z_{d2}} \\ \sqrt{Z_{m12}-Z_{m11}}\sqrt{Z_{m13}-Z_{m11}}\sqrt{Z_{m13}-Z_{m12}} - \\ \left\{ \begin{array}{l} (Z_{d3}-Z_{d2})Z_{m12}Z_{m13} + \\ (Z_{d1}-Z_{d3})Z_{m11}Z_{m13} + \\ (Z_{d2}-Z_{d1})Z_{m11}Z_{m12} \end{array} \right\} \end{bmatrix} \Big/ denom$$

$$Z_{12} = \pm\sqrt{\frac{(Z_{d2}-Z_{d1})(Z_{d3}^2 + (-Z_{d2}-Z_{d1})Z_{d3} + Z_{d1}Z_{d2})}{(Z_{m12}-Z_{m11})(Z_{m13}^2 + (-Z_{m12}-Z_{m11})Z_{m13} + Z_{m11}Z_{m12})}} \Big/ denom$$

$Z_{e1}$ can be determined using the following equation [Equation 5c] if $Z_{11}$ and $Z_{12}$ of the equation [Equation 5b] are substituted in the equation [Equation 5a]. However, $Z_{e1}$ is not used in an error correction calculation, namely, in an equation [Equation 7] to be described later.

$$Z_{e1} = \frac{Z_{m11}Z_{12} - Z_{11}Z_{12}}{Z_{11} + Z_{12} - Z_{m11}} - Z_{d1} \quad \text{[Equation 5c]}$$

Additionally, the equation [Equation 5c] can be determined using $Z_{m12}$ and $Z_{d2}$ or $Z_{m13}$ and $Z_{d3}$ instead of $Z_{m11}$ and $Z_{d1}$.

Figure 17:
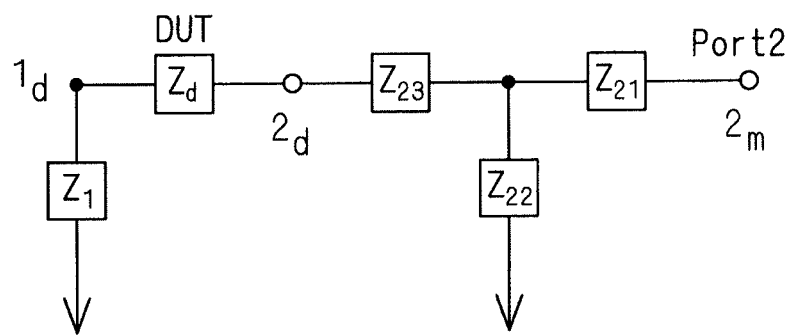
FIG. 17 is a circuit diagram of an equivalent circuit viewed from a port-1 side (embodiment 1).

Since the port 1 is simply terminal impedance when viewed from the port 2, an equivalent circuit shown in FIG. 17 is obtained. Here, $Z_1$ is equivalent impedance of the port 1.

Careful observation of FIG. 17 reveals that $Z_{23}$, $Z_d$, and $Z_1$ are simply connected in series. Accordingly, if $Z_{23}$ and $Z_1$ are collectively shown as $Z_{e2}$, the equivalent circuit can be modified as shown in FIG. 18.

Figure 18:
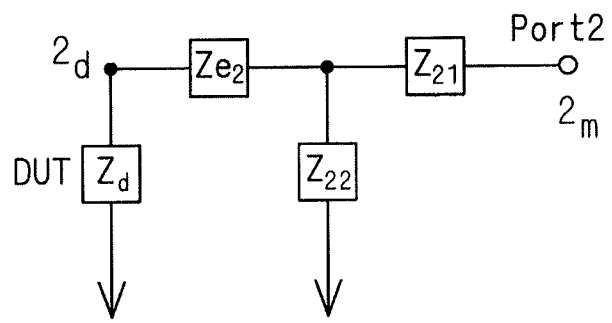
FIG. 18 is a circuit diagram of an equivalent circuit viewed from a port-1 side (embodiment 1).

Since three values $Z_{21}$, $Z_{22}$, and $Z_{e2}$ of an error model shown in FIG. 18 are unknown, these unknown values are determined if three sets of measurement values $Z_m$ resulting from measurement of correction data acquisition samples $Z_d$ are acquired.

More specifically, when impedance values of three correction data acquisition samples (i=1, 2, and 3) and measured values thereof are denoted as $Z_{di}$ and $Z_{m2i}$, respectively, the following equation [Equation 6a] is satisfied.

$$Z_{m21} = \frac{(Z_{e2} + Z_{d1})Z_{22}}{Z_{22} + Z_{e2} + Z_{d1}} + Z_{21} \quad \text{[Equation 6a]}$$

$$Z_{m22} = \frac{(Z_{e2} + Z_{d2})Z_{22}}{Z_{22} + Z_{e2} + Z_{d2}} + Z_{21}$$

$$Z_{m23} = \frac{(Z_{e3} + Z_{d3})Z_{22}}{Z_{22} + Z_{e3} + Z_{d3}} + Z_{21}$$

The following equation [Equation 6b] is determined by determining error factors $Z_{21}$ and $Z_{22}$ from the equation [Equation 6a] regarding the three correction data acquisition samples (i=1, 2, and 3). Which of positive and negative different solutions of the equation to be selected will be described later.

[Equation 6b]

$$denom = (Z_{d2} - Z_{d1})Z_{m23} + (Z_{d1} - Z_{d3})Z_{m22} + (Z_{d3} - Z_{d2})Z_{m21}$$

$$Z_{21} = \begin{bmatrix} \pm\sqrt{Z_{d2}-Z_{d1}}\sqrt{Z_{d3}-Z_{d1}}\sqrt{Z_{d3}-Z_{d2}} \\ \sqrt{Z_{m22}-Z_{m21}}\sqrt{Z_{m23}-Z_{m21}}\sqrt{Z_{m23}-Z_{m22}} - \\ \left\{ \begin{array}{l} (Z_{d3}-Z_{d2})Z_{m22}Z_{m23} + \\ (Z_{d1}-Z_{d3})Z_{m21}Z_{m23} + \\ (Z_{d2}-Z_{d1})Z_{m21}Z_{m22} \end{array} \right\} \end{bmatrix} \Big/ denom$$

$$Z_{22} = \pm\sqrt{\frac{(Z_{d2}-Z_{d1})(Z_{d3}^2 + (-Z_{d2}-Z_{d1})Z_{d3} + Z_{d1}Z_{d2})}{(Z_{m22}-Z_{m21})(Z_{m23}^2 + (-Z_{m22}-Z_{m21})Z_{m23} + Z_{m21}Z_{m22})}} \Big/ denom$$

$Z_{e2}$ can be determined using the following equation [Equation 6c] if $Z_{21}$ and $Z_{22}$ of the equation [Equation 6b] are substituted in the equation [Equation 6a]. However, $Z_{e2}$ is not used in an error correction calculation, namely, in the equation [Equation 7] to be described later.

$$Z_{e2} = \frac{Z_{m21}Z_{12} - Z_{11}Z_{12}}{Z_{11} + Z_{12} - Z_{m21}} - Z_{d1} \quad \text{[Equation 6c]}$$

Additionally, the equation [Equation 6c] can be determined using $Z_{m22}$ and $Z_{d2}$ or $Z_{m23}$ and $Z_{d3}$ instead of $Z_{m21}$ and $Z_{d1}$.

In the above-described manner, the error model excluding $Z_{13}$ and $Z_{23}$ is determined.

Meanwhile, the values $Z_{13}$ and $Z_{23}$ cannot be determined by simply series-connecting the correction data acquisition samples.

Figure 19:
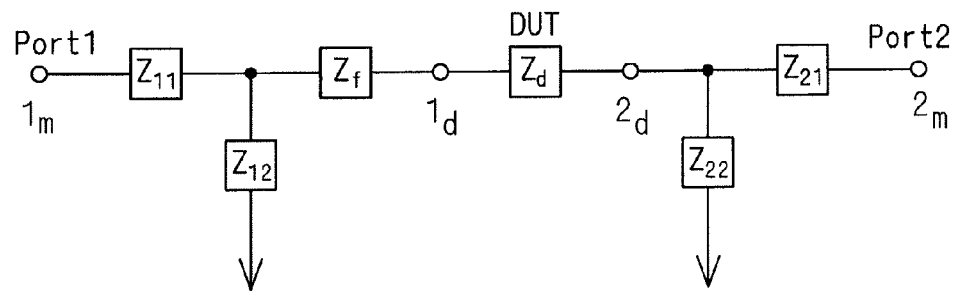
FIG. 19 is a circuit diagram of an equivalent circuit viewed from a port-1 side (embodiment 1).

However, since $Z_{13}$ and $Z_{23}$ are connected in series, the values thereof do not have to be determined separately and independently. Accordingly, the error model can be revised as shown in FIG. 19. In the drawing, $Z_f$ is an error factor that can be considered as serial connection of $Z_{13}$ and $Z_{23}$ (i.e., a sum of the values).

In the error model shown in FIG. 19, impedance $Z_{11}$ and $Z_f$ are connected in series between a terminal $1_m$ and a terminal $1_d$, impedance $Z_{12}$ is connected between ground and a connection point of the impedance $Z_{11}$ and $Z_f$, impedance $Z_{21}$ is connected between a terminal $2_d$ and a terminal $2_m$, and impedance $Z_{22}$ is connected between the terminal $2_d$ and ground.

Since the impedance viewed from, for example, the port 1 indicates a state where the port-2 side of the error model shown in FIG. 19 is reflection-free termination (i.e., generally, a state where 50Ω is connected), $Z_f$ can be determined from a set of values $Z_a$ of the correction data acquisition samples and measured values $Z_m$ obtained when the samples are connected.

There are three combinations of the value $Z_{ai}$ of the correction data acquisition sample and the measured value $Z_{mi}$ obtained when the sample is connected regarding the three correction data acquisition samples (i=1, 2, and 3). $Z_{fi}$ can be determined using the following equation [Equation 7]. Meanwhile, $Z_0$ of the equation represents characteristic impedance.

$$Z_{f1} = -[\{(Z_{22} + (Z_{21} + Z_0))Z_{d1} +$$
$$((Z_{21} + Z_0) + Z_{12})Z_{22} + Z_{12}(Z_{21} + Z_0)\}Z_{m11} +$$
$$\{(-Z_{12} - Z_{11})Z_{22} + (-Z_{12} - Z_{11})(Z_{21} + Z_0)\}Z_{d1} +$$
$$\{(-Z_{12} - Z_{11})(Z_{21} + Z_0) - Z_{11}Z_{12}\}Z_{22} -$$
$$Z_{11}Z_{12}(Z_{21} + Z_0)] / [\{(Z_{22} + (Z_{21} + Z_0)\}Z_{m11} +$$
$$(-Z_{12} - Z_{11})Z_{22} + (-Z_{12} - Z_{11})(Z_{21} + Z_0)]$$

$$Z_{f2} = -[\{(Z_{22} + (Z_{21} + Z_0))Z_{d2} + ((Z_{21} + Z_0) + Z_{12})Z_{22} +$$
$$Z_{12}(Z_{21} + Z_0)\}Z_{m12} +$$
$$\{(-Z_{12} - Z_{11})Z_{22} + (-Z_{12} - Z_{11})(Z_{21} + Z_0)\}Z_{d2} +$$
$$\{(-Z_{12} - Z_{11})(Z_{21} + Z_0) - Z_{11}Z_{12}\}Z_{22} -$$
$$Z_{11}Z_{12}(Z_{21} + Z_0)] / [\{(Z_{22} + (Z_{21} + Z_0)\}Z_{m12} +$$
$$(-Z_{12} - Z_{11})Z_{22} + (-Z_{12} - Z_{11})(Z_{21} + Z_0)]$$

$$Z_{f3} = -[\{(Z_{22} + (Z_{21} + Z_0))Z_{d3} + ((Z_{21} + Z_0) + Z_{12})Z_{22} +$$
$$Z_{12}(Z_{21} + Z_0)\}Z_{m13} +$$
$$\{(-Z_{12} - Z_{11})Z_{22} + (-Z_{12} - Z_{11})(Z_{21} + Z_0)\}$$
$$Z_{d3} + \{(-Z_{12} - Z_{11})(Z_{21} + Z_0) - Z_{11}Z_{12}\}Z_{22} -$$
$$Z_{11}Z_{12}(Z_{21} + Z_0)] / [\{(Z_{22} + (Z_{21} + Z_0)\}Z_{m13} +$$
$$(-Z_{12} - Z_{11})Z_{22} + (-Z_{12} - Z_{11})(Z_{21} + Z_0)]$$

[Equation 7]

Since one value is determined for $Z_f$, values of $Z_{f1}$, $Z_{f2}$, and $Z_{f3}$ determined using the equation [Equation 7] should be the same. However, since two solutions of opposite signs exist regarding $Z_{11}$, $Z_{12}$, $Z_{21}$, and $Z_{22}$ as shown by the equations [Equation 5b] and [Equation 6b], $Z_{f1}$, $Z_{f2}$, and $Z_{f3}$ may not match depending on the combinations.

Accordingly, $Z_{f1}$, $Z_{f2}$, and $Z_{f3}$ of the above-described equation [Equation 7] are calculated for each of $2^4$=16 combination patterns shown in the following table 1 and a combination of $Z_{11}$, $Z_{12}$, $Z_{21}$, and $Z_{22}$ yielding the matching $Z_{f1}$, $Z_{f2}$, and $Z_{f3}$ is selected. Since a plurality of combinations yielding the matching $Z_{f1}$, $Z_{f2}$, and $Z_{f3}$ exist, any one of the combinations can be used.

TABLE 1

|  | sign of $Z_{11}$ | sign of $Z_{21}$ | sign of $Z_{12}$ | sign of $Z_{22}$ |
| --- | --- | --- | --- | --- |
| pattern 1 | + | + | + | + |
| pattern 2 | + | + | + | − |
| pattern 3 | + | + | − | + |
| pattern 4 | + | + | − | − |
| pattern 5 | + | − | + | + |
| pattern 6 | + | − | + | − |
| pattern 7 | + | − | − | + |
| pattern 8 | + | − | − | − |
| pattern 9 | − | + | + | + |
| pattern 10 | − | + | + | − |
| pattern 11 | − | + | − | + |
| pattern 12 | − | + | − | − |
| pattern 13 | − | − | + | + |
| pattern 14 | − | − | + | − |
| pattern 15 | − | − | − | + |
| pattern 16 | − | − | − | − |

TABLE 1-continued

Since $Z_{13}$ and $Z_{23}$ are connected in series to form an error factor $Z_f$, the same result as the correction based on FIG. 14 can be obtained if correction is performed based on the error model shown in FIG. 19 as long as the correction data acquisition sample realizes series connection of the two-terminal impedance element.

<Principle 2> A two-port measurement-error correction principle applied to a case of shunt measurement will be described with reference to FIG. 20 to FIG. 25.

Figure 20:
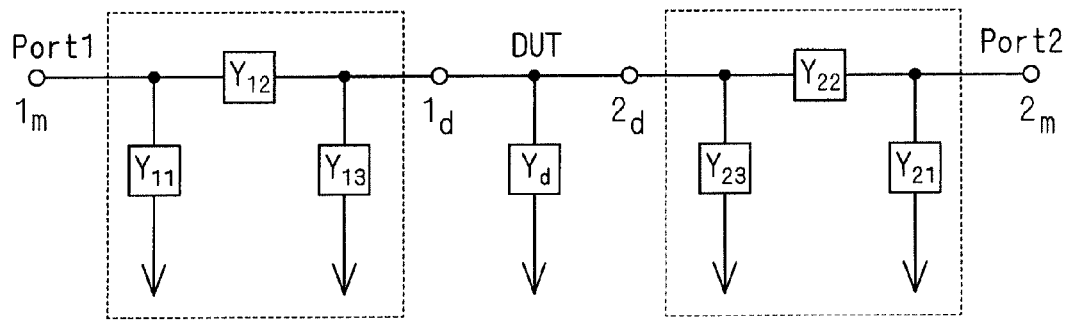
FIG. 20 is a circuit diagram of shunt-connected error models (embodiment 2).

At the time of shunt measurement of a two-terminal impedance element, a π-type impedance connection circuit (this is also not general as a circuit parameter) is adopted as an error parameter. FIG. 20 shows error models thereof. In the drawing, a part enclosed by a dotted line indicates an error model of each port. The error models are connected between terminals $1_m$ and $2_m$ at which a subject is measured by a reference measuring system and terminals $1_d$ and $2_d$ at which the subject is measured by a correction-target measuring system. A variable represents admittance. Although the circuit model differs from a case of series measurement, these models are convertible. In addition, a part represented as DUT is the subject. Since the model shows shunt measurement of a two-terminal impedance element, the subject can be modeled as a two-terminal impedance element.

As in the case of series measurement, determination of parameter values of the error model shown in the drawing from measurement results of correction data acquisition samples is a purpose of the correction. Also in this case, correction data acquisition samples are simply connected in a state shown in the drawing to avoid a problem, such as complication of a fixture.

Although equivalent circuits seemingly differ, parameters of the error model can be determined in a procedure similar to the case of series connection.

Figure 21:
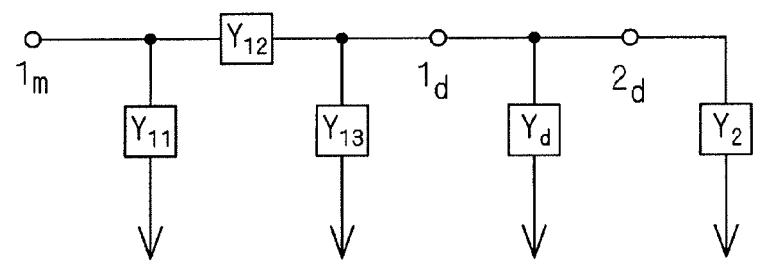
FIG. 21 is a circuit diagram of an equivalent circuit viewed from a port-1 side (embodiment 2).

First, since a port 2 is simply terminal admittance when viewed from a port 1, an equivalent circuit shown in FIG. 21 is obtained. Here, $Y_2$ is equivalent admittance of the port 2.

Figure 22:
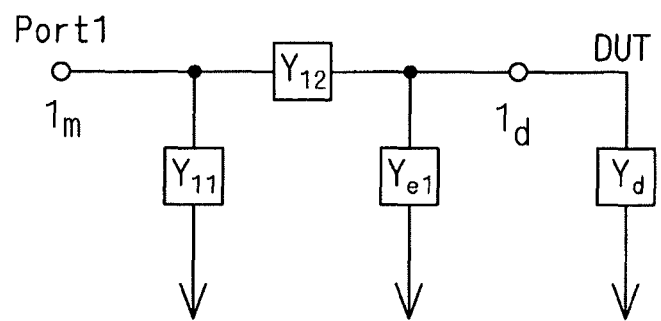
FIG. 22 is a circuit diagram of an equivalent circuit viewed from a port-1 side (embodiment 2).

Since $Y_{13}$, $Y_d$, $Y_2$ shown in FIG. 21 are connected in parallel, the equivalent circuit can be modified as shown in FIG. 22 if $Y_{13}$ and $Y_2$ are collectively represented as $Y_{e1}$.

As in the case of series measurement, there are three unknown values in the error model shown in FIG. 22, these unknown values can be determined by measurement of three correction data acquisition samples. When variable names are determined according to the case of series measurement, the following equation [Equation 8a] is satisfied.

$$Y_{m11} = \frac{(Y_{e1} + Y_{d1})Y_{12}}{Y_{12} + Y_{e1} + Y_{d1}} + Y_{11}$$

$$Y_{m12} = \frac{(Y_{e1} + Y_{d2})Y_{12}}{Y_{12} + Y_{e1} + Y_{d2}} + Y_{11}$$

$$Y_{m13} = \frac{(Y_{e1} + Y_{d3})Y_{12}}{Y_{12} + Y_{e1} + Y_{d3}} + Y_{11}$$

[Equation 8a]

Error factors can be calculated by the following equation [Equation 8b], which is determined from the equation [Equation 8a].

[Equation 8b]

$$denom = (Y_{d2} - Y_{d1})Y_{m13} + (Y_{d1} - Y_{d3})Y_{m12} + (Y_{d3} - Y_{d2})Y_{m11}$$

$$Y_{11} = \pm \left[ \begin{array}{c} \pm\sqrt{Y_{d2} - Y_{d1}}\sqrt{Y_{d3} - Y_{d1}}\sqrt{Y_{d3} - Y_{d2}} \\ \sqrt{Y_{m12} - Y_{m11}}\sqrt{Y_{m13} - Y_{m11}}\sqrt{Y_{m13} - Y_{m12}} - \\ \left\{ \begin{array}{c} (Y_{d3} - Y_{d2})Y_{m12}Y_{m13} + \\ (Y_{d1} - Y_{d3})Y_{m11}Y_{m13} + \\ (Y_{d2} - Y_{d1})Y_{m11}Y_{m12} \end{array} \right\} \end{array} \right] / denom$$

$$Y_{12} = \pm \sqrt{\frac{(Y_{d2} - Y_{d1})(Y_{d3}^2 + (-Y_{d2} - Y_{d1})Y_{d3} + Y_{d1}Y_{d2})}{(Y_{m12} - Y_{m11})(Y_{m13}^2 + (-Y_{m12} - Y_{m11})Y_{m13} + Y_{m11}Y_{m12})}} / denom$$

Although $Y_{e1}$ can be determined using the following equation [Equation 8c] by substituting $Y_{11}$ and $Y_{12}$ determined by the equation [Equation 8b] in the equation [Equation 8a], $Y_{e1}$ is not used in an error correction calculation, namely, an equation [Equation 10] to be described later.

$$Y_{e1} = \frac{Y_{m11}Y_{12} - Y_{11}Y_{12}}{Y_{11} + Y_{12} - Y_{m11}} - Y_{d1}$$ [Equation 8c]

The equation [Equation 8c] can be determined using $Y_{m12}$ and $Y_{d2}$ or $Y_{m13}$ and $Y_{d3}$ instead of $Y_{m11}$ and $Y_{d1}$.

In fact, this equation [Equation 8b] is substantially the same as the equation used in the series measurement. Which of positive and negative different solutions of the equation to be selected will be described later.

Determination of unknown values when viewed from the port 2 will be described next.

Figure 23:
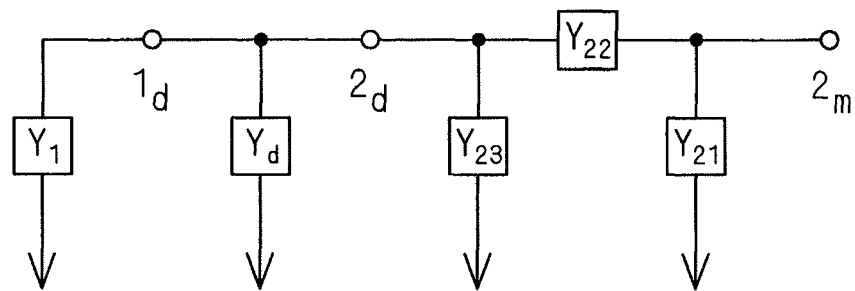
FIG. 23 is a circuit diagram of an equivalent circuit viewed from a port-1 side (embodiment 2).

Since the port 1 is simply terminal admittance when viewed from the port 2, an equivalent circuit shown in FIG. 23 is obtained. Here, $Y_1$ is equivalent admittance of the port 1.

Figure 24:
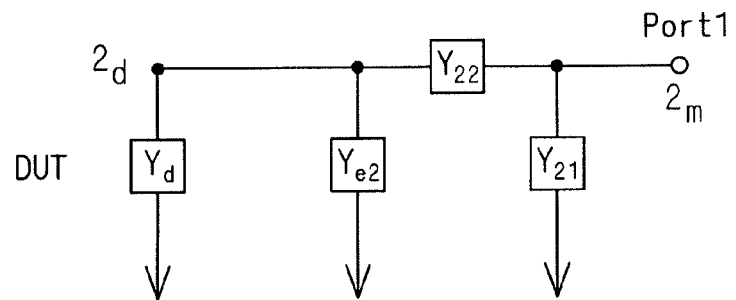
FIG. 24 is a circuit diagram of an equivalent circuit viewed from a port-1 side (embodiment 2).

Since $Y_{23}$, $Y_d$, and $Y_1$ shown in FIG. 23 are connected in parallel, the equivalent circuit can be modified as shown in FIG. 24 when $Y_{23}$ and $Y_1$ are collectively represented as $Y_{e2}$.

When variable names are determined according to the case of the port 1, an equation of error factors can be determined in the similar manner and the following equation [Equation 9a] is satisfied.

$$Y_{m21} = \frac{(Y_{e1} + Y_{d1})Y_{22}}{Y_{22} + Y_{e2} + Y_{d1}} + Y_{21}$$ [Equation 9a]

$$Y_{m22} = \frac{(Y_{e1} + Y_{d2})Y_{22}}{Y_{22} + Y_{e1} + Y_{d2}} + Y_{21}$$

$$Y_{m23} = \frac{(Y_{e1} + Y_{d3})Y_{22}}{Y_{22} + Y_{e1} + Y_{d3}} + Y_{21}$$

The error factors can be calculated using the following equation [Equation 9b], which is determined from the equation [Equation 9a].

[Equation 9b]

$$denom = (Y_{d2} - Y_{d1})Y_{m23} + (Y_{d1} - Y_{d3})Y_{m22} + (Y_{d3} - Y_{d2})Y_{m21}$$

$$Y_{21} = \left[ \begin{array}{c} \pm\sqrt{Y_{d2} - Y_{d1}}\sqrt{Y_{d3} - Y_{d1}}\sqrt{Y_{d3} - Y_{d2}} \\ \sqrt{Y_{m22} - Y_{m21}}\sqrt{Y_{m23} - Y_{m21}}\sqrt{Y_{m23} - Y_{m22}} - \\ \left\{ \begin{array}{c} (Y_{d3} - Y_{d2})Y_{m22}Y_{m23} + \\ (Y_{d1} - Y_{d3})Y_{m21}Y_{m23} + \\ (Y_{d2} - Y_{d1})Y_{m21}Y_{m22} \end{array} \right\} \end{array} \right] / denom$$

$$Y_{22} = \pm \sqrt{\frac{(Y_{d2} - Y_{d1})(Y_{d3}^2 + (-Y_{d2} - Y_{d1})Y_{d3} + Y_{d1}Y_{d2})}{(Y_{m22} - Y_{m21})(Y_{m23}^2 + (-Y_{m22} - Y_{m21})Y_{m23} + Y_{m21}Y_{m22})}} / denom$$

Although $Y_{e2}$ can be determined using the following equation [Equation 9c] by substituting $Y_{21}$ and $Y_{22}$ determined by the equation [Equation 9b] in the equation [Equation 9a], $Y_{e2}$ is not used in an error correction calculation, namely, the equation [Equation 10] to be described later.

$$Y_{e1} = \frac{Y_{m21}Y_{12} - Y_{11}Y_{12}}{Y_{11} + Y_{12} - Y_{m21}} - Y_{d1}$$ [Equation 9c]

The equation [Equation 9c] can be determined using $Y_{m22}$ and $Y_{d2}$ or $Y_{m23}$ and $Y_{d3}$ instead of $Y_{d21}$ and $Y_{d1}$.

Figure 25:
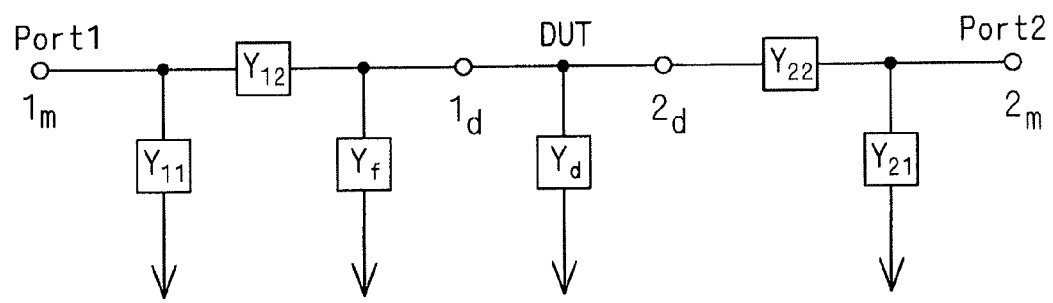
FIG. 25 is a circuit diagram of an equivalent circuit viewed from a port-1 side (embodiment 2).

It is impossible to determine the error factors $Y_{13}$ and $Y_{23}$, which have not determined in the above-described procedure, by simply shunt-connecting correction data acquisition samples. However, since $Y_{13}$ and $Y_{23}$ are connected in parallel and values thereof do not have to be determined separately and independently, the error model is revised as shown in FIG. 25. In the drawing, $Y_f$ is an error factor that can be considered as parallel connection of $Y_{13}$ and $Y_{23}$ (i.e., a sum of the values).

In the error model shown in FIG. 25, admittance $Y_{12}$ is connected between a terminal $1_m$ and a terminal $1_d$, admittance $Y_{11}$ is connected between ground and a connection point of the terminal $1_m$ and the admittance $Y_{12}$, admittance $Y_f$ is connected between ground and a connection point of the admittance $Y_{12}$ and the terminal $1_d$, admittance $Y_{22}$ is connected between a terminal $2_d$ and a terminal $2_m$, and admittance $Y_{21}$ is connected between ground and a connection point of the admittance $Y_{22}$ and the terminal $2_m$.

Since the impedance viewed from, for example, the port 1 indicates a state where the port-2 side of the error model shown in FIG. 23 is reflection-free termination (i.e., generally, a state where 50Ω is connected), $Y_f$ can be determined from a set of values $Y_d$ of the correction data acquisition samples and measured values $Y_m$ measured when the samples are connected. This respect is the same as the case of series measurement. $Y_{fi}$ can be determined using the following equation [Equation 10]. In the equation, $Y_0$ represents characteristic admittance.

$$Y_{f1} = -\begin{bmatrix} \begin{Bmatrix} (Y_{22}+(Y_{21}+Y_0))Y_{d1}+ \\ ((Y_{21}+Y_0)+Y_{12})Y_{22}+ \\ Y_{12}(Y_{21}+Y_0) \end{Bmatrix} Y_{m11} + \\ \begin{Bmatrix} (-Y_{12}-Y_{11})Y_{22}+ \\ (-Y_{12}-Y_{11})(Y_{21}+Y_0) \end{Bmatrix} Y_{d1} + \\ \begin{Bmatrix} (-Y_{12}-Y_{11})(Y_{21}+Y_0)- \\ Y_{11}Y_{12} \end{Bmatrix} Y_{22} - \\ Y_{11}Y_{12}(Y_{21}+Y_0) \end{bmatrix} \Bigg/ \begin{bmatrix} \{(Y_{22}+(Y_{21}+Y_0)\}Y_{m11}+ \\ (-Y_{12}-Y_{11})Y_{22}+ \\ (-Y_{12}-Y_{11})(Y_{21}+Y_0) \end{bmatrix}$$

[Equation 10]

$$Y_{f2} = -\begin{bmatrix} \begin{Bmatrix} (Y_{22}+(Y_{21}+Y_0))Y_{d2}+ \\ ((Y_{21}+Y_0)+Y_{12})Y_{22}+ \\ Y_{12}(Y_{21}+Y_0) \end{Bmatrix} Y_{m12} + \\ \begin{Bmatrix} (-Y_{12}-Y_{11})Y_{22}+ \\ (-Y_{12}-Y_{11})(Y_{21}+Y_0) \end{Bmatrix} Y_{d2} + \\ \{(-Y_{12}-Y_{11})(Y_{21}+Y_0)-Y_{11}Y_{12}\}Y_{22}- \\ Y_{11}Y_{12}(Y_{21}+Y_0) \end{bmatrix} \Bigg/ \begin{bmatrix} \{(Y_{22}+(Y_{21}+Y_0)\} \\ Y_{m12}+(-Y_{12}-Y_{11}) \\ Y_{22}+(-Y_{12}-Y_{11}) \\ (Y_{21}+Y_0) \end{bmatrix}$$

$$Y_{f3} = -\begin{bmatrix} \begin{Bmatrix} (Y_{22}+(Y_{21}+Y_0))Y_{d3}+ \\ ((Y_{21}+Y_0)+Y_{12}) \\ Y_{22}+Y_{12}(Y_{21}+Y_0) \end{Bmatrix} Y_{m13} + \\ \begin{Bmatrix} (-Y_{12}-Y_{11})Y_{22}+ \\ (-Y_{12}-Y_{11})(Y_{21}+Y_0) \end{Bmatrix} Y_{d3} + \\ \begin{Bmatrix} (-Y_{12}-Y_{11}) \\ (Y_{21}+Y_0)-Y_{11}Y_{12} \end{Bmatrix} Y_{22} - \\ Y_{11}Y_{12}(Y_{21}+Y_0) \end{bmatrix} \Bigg/ \begin{bmatrix} \{(Y_{22}+(Y_{21}+Y_0)\}Y_{m13}+ \\ (-Y_{12}-Y_{11})Y_{22}+ \\ (-Y_{12}-Y_{11})(Y_{21}+Y_0) \end{bmatrix}$$

Since one value is determined for $Y_f$, values of $Y_{f1}$, $Y_{f2}$, and $Y_{f3}$ determined using the equation [Equation 10] should be the same. However, since two different solutions of opposite signs exist regarding $Y_{11}$, $Y_{12}$, $Y_{21}$, and $Y_{22}$ as shown by the equations [Equation 8b] and [Equation 9b], $Y_{f1}$, $Y_{f2}$, and $Y_{f3}$ may not match depending on the combinations.

Accordingly, $Y_{f1}$, $Y_{f2}$, and $Y_{f3}$ of the above-described equation [Equation 10] is determined regarding each of $2^4=16$ combination patterns shown in the following table 2 and a combination of $Y_{11}$, $Y_{12}$, $Y_{21}$, and $Y_{22}$ yielding the matching $Y_{f1}$, $Y_{f2}$, and $Y_{f3}$ is selected. Since a plurality of combinations yielding the matching $Y_{f1}$, $Y_{f2}$, and $Y_{f3}$ exist, any one of the combinations can be used.

TABLE 2

| | sign of $Y_{11}$ | sign of $Y_{21}$ | sign of $Y_{12}$ | sign of $Y_{22}$ |
|---|---|---|---|---|
| pattern 1 | + | + | + | + |
| pattern 2 | + | + | + | − |
| pattern 3 | + | + | − | + |
| pattern 4 | + | + | − | − |
| pattern 5 | + | − | + | + |
| pattern 6 | + | − | + | − |
| pattern 7 | + | − | − | + |
| pattern 8 | + | − | − | − |
| pattern 9 | − | + | + | + |
| pattern 10 | − | + | + | − |
| pattern 11 | − | + | − | + |
| pattern 12 | − | + | − | − |
| pattern 13 | − | − | + | + |
| pattern 14 | − | − | + | − |
| pattern 15 | − | − | − | + |
| pattern 16 | − | − | − | − |

Since $Y_{13}$ and $Y_{23}$ are connected in parallel to form the error factor $Y_f$, the same result as the correction based on FIG. 20 can be obtained if correction is performed based on the error model shown in FIG. 25 as long as the correction data acquisition sample realizes shunt connection of the two-terminal impedance element.

Embodiments will be described next with reference to FIG. 10 to FIG. 13.

<Embodiment 1> A case of series connection will be described with reference to FIG. 10 and FIG. 11. The series connection is a method for connecting a measurement subject between two ports of a measuring device.

Figure 10A:
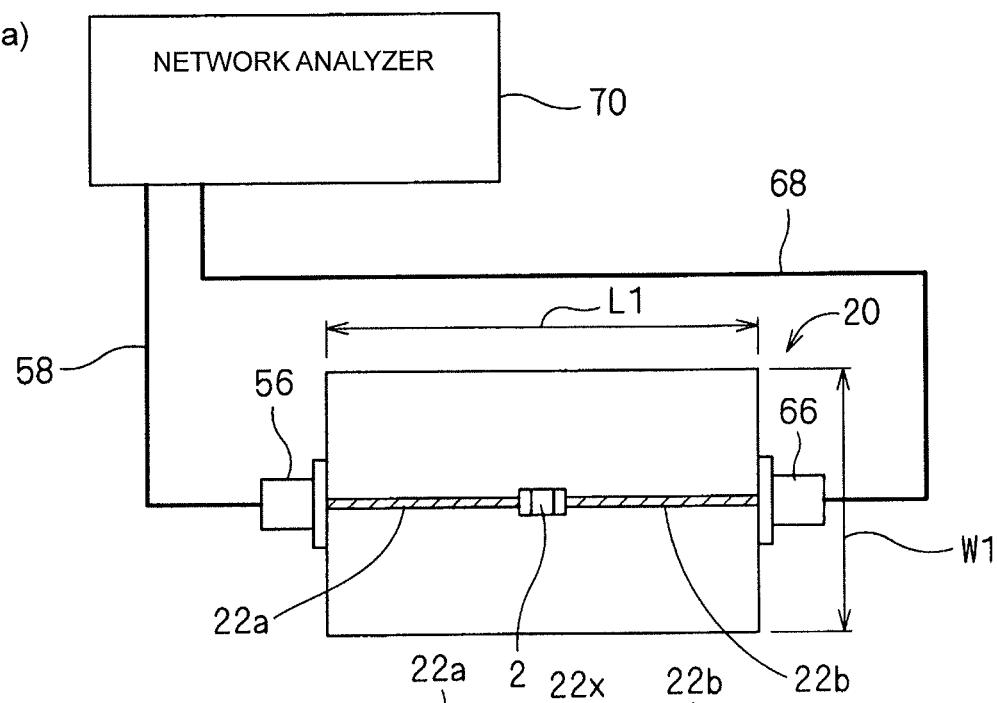
FIGS. 10(a) and 10(b) are a configuration diagram of a measuring system and an elevational view of a measurement board, respectively (embodiment 1).
Figure 10B:
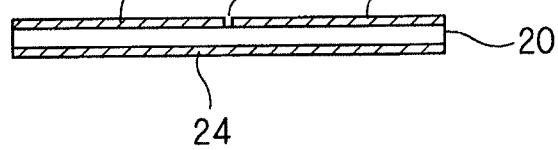

In a correction-target measuring system, as shown by an entire configuration diagram in FIG. 10(a) and an elevational view of a measurement board 20 in (b), a subject electronic component 2 is arranged to extend over a slit 22x located between transmission lines 22a and 22b formed on an upper face of the measurement board 20 and is connected to the transmission lines 22a and 22b in series. SMA connectors 56 and 66 are soldered to respective ends of the transmission lines 22a and 22b and a transmission line 24 formed on the upper face and a lower face of the measurement board 20 and are connected to coaxial cables 58 and 68 through a network analyzer 70, respectively. A network analyzer 8753D available from Agilent Technologies, Inc. is used as the network analyzer 70. The measurement board 20 is designed to have 50Ω characteristic impedance. The length L and width W of the measurement board 20 are equal to 50 mm and 30 mm, respectively.

In a reference measuring system, measurement is performed by attaching a fixture 16192A available from Agilent Technologies, Inc. to an impedance analyzer 4291 available from Agilent Technologies, Inc.

The subject electronic component 2 is a 56 nH chip inductor of 1.0 mm×0.5 mm.

A measurement and correction work will be sequentially described.

(1) Three correction data acquisition samples are prepared. 2.2Ω, 51Ω, and 510Ω resistors were used as the three correction data acquisition samples.

(2) Impedance $Z_{d1}$, $Z_{d2}$, and $Z_{d3}$ of the correction data acquisition samples are measured by a reference measuring system. The number of measurement points and a sweep-frequency range have to be unified in the reference measuring device and the actually-used network analyzer.

(3) In the measuring device (8753D) actually used for measurement, a transmission line to an end of a coaxial cable is calibrated. This calibration may be generally performed SOLT calibration.

(4) Impedance of the correction data acquisition samples is measured by the measuring device (8753D) actually used for measurement. At this time, $Z_{m11}$, $Z_{m12}$, $Z_{m13}$, $Z_{m21}$, $Z_{m22}$, and $Z_{m23}$ are acquired using the same number of measurement points and the same sweep-frequency range as those of the reference measuring device.

(5) A correction coefficient is calculated with a personal computer on the basis of the above-described <Principle 1> from the data measured by the reference measuring device (4291) and the measuring device (8753D) actually used for measurement. This procedure corresponds to a measuring system correction procedure.

(6) The measuring device (8753D) actually used for measurement performs measurement on the chip inductor.

(7) A corrected measured value is calculated with a personal computer using the measured data and the correction data.

As a result of the measurement and correction processing performed in the above-described manner, the result measured by the reference measuring device matched the value measured by the network analyzer.

FIG. 11 shows graphs of results obtained by performing the measurement and correction processing on a 1005-size chip inductor (52 nH). FIG. 11(a) shows a graph of a reference value, a measured value before correction, and a measured value after correction. The "reference value" indicates a value measured by the reference measuring device. The "measured value before correction" indicates a measured result of the measuring device actually used for measurement and is an uncorrected measured value. The "measured value after correction" indicates a value obtained by correcting the measured value of the measuring device actually used for measurement (estimated value of the measured value obtained when the value is measured by the reference measuring device). FIG. 11(b-1), FIG. 11(b-2), and FIG. 11(c) show a graph of the measured value "before correction", a graph of the measured value "after correction", and a graph of the "reference value", respectively.

Figure 11A:
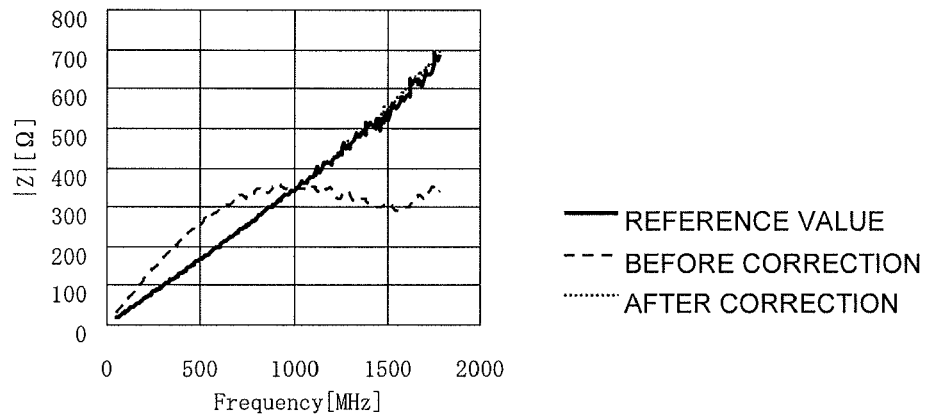
FIGS. 11(a), 11(b-1), 11(b-2) and 11(c) are graphs showing chip inductor measurement results (embodiment 1).
Figure 11A:
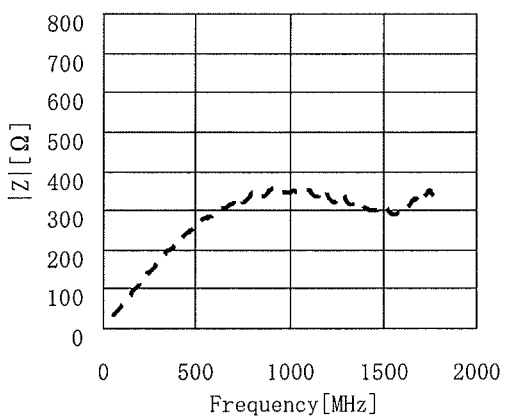
Figure 11A:
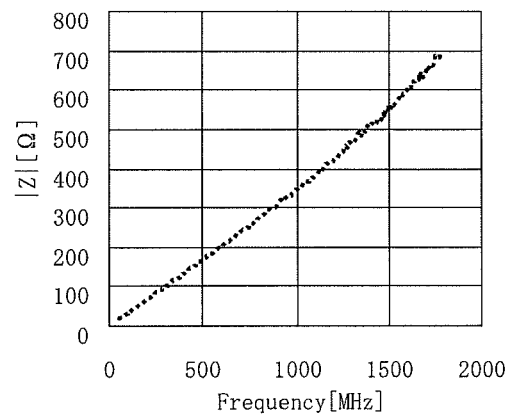
Figure 11C:
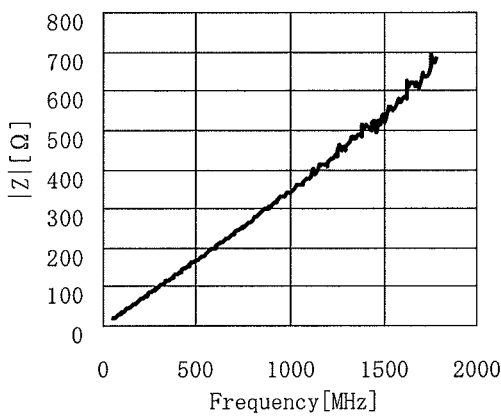

As shown in FIG. 11(a), although the "reference value" and the "value after correction" resemble like the values cannot be discriminated from one another in the drawing, the "value before correction" is significantly shifted from the "reference value". More specifically, although a measured value significantly shifted from the measured value of the reference measuring device is obtained without the correction, a measured value extremely close to the measured value of the reference measuring device can be obtained by performing the correction.

<Embodiment 2> A case of shunt connection will be described with reference to FIG. 12 and FIG. 13. The shunt connection is a method for connecting a measurement subject between one port of a measuring device and ground.

Figure 12A:
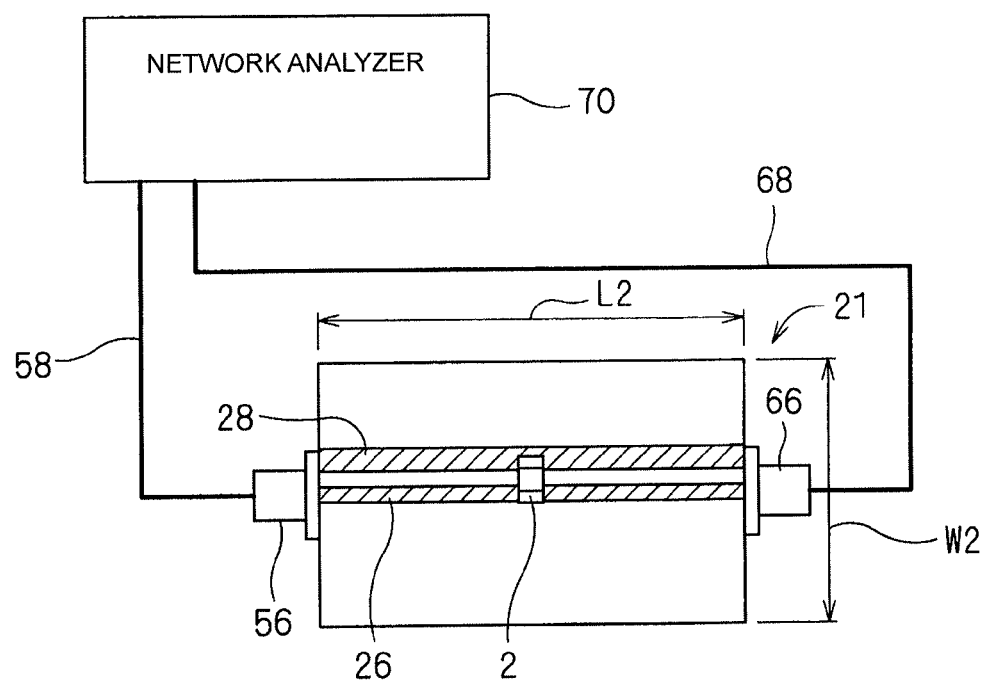
FIGS. 12(a) and 12(b) are a configuration diagram of a measuring system and an elevational view of a measurement board, respectively (embodiment 2).
Figure 12B:
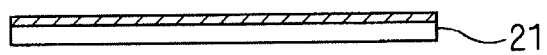

In a correction-target measuring system, as shown by an entire configuration diagram in FIG. 12(a) and an elevational view of measurement board in (b), a subject electronic component 2 is connected between a signal conductor 26 and a ground conductor 28 formed on an upper face of a measurement board 21. SMA connectors 56 and 66 are soldered to respective ends of the signal conductor 26 and the ground conductor 28 of the measurement board 21 and are connected to a network analyzer 70 through coaxial cables 58 and 68, respectively. A network analyzer 8753D available from Agilent Technologies, Inc. is used as the network analyzer 70. The measurement board 21 is designed to have 50Ω characteristic impedance. The length L and width W of the measurement board 21 are equal to 50 mm and 30 mm, respectively.

In a reference measuring system, measurement is performed by attaching a fixture 16192A available from Agilent Technologies, Inc. to an impedance analyzer 4291 available from Agilent Technologies, Inc.

The subject electronic component 2 is a 50Ω chip resistor of 1.0 mm×0.5 mm.

A measurement and correction work will be sequentially described next.

(1) Three correction data acquisition samples are prepared. 2.2Ω, 51Ω, and 510Ω resistors were used.

(2) Admittance $Y_{d1}$, $Y_{d2}$, and $Y_{d3}$ of the correction data acquisition samples are measured by the reference measuring device. The number of measurement points and a sweep-frequency range have to be unified in the reference measuring device and the actually-used network analyzer.

(3) In the measuring device (8753D) actually used for measurement, a transmission line to an end of a coaxial cable is calibrated. This calibration may be generally performed SOLT calibration.

(4) Admittance of the correction data acquisition samples is measured by the measuring device (8753D) actually used for measurement. At this time, $Y_{m11}$, $Y_{m12}$, $Y_{m13}$, $Y_{m21}$, $Y_{m22}$, and $Y_{m23}$ are acquired using the same number of measurement points and the same sweep-frequency range as those of the reference measuring device.

(5) A correction coefficient is calculated with a personal computer on the basis of the above-described <Principle 2>from the data measured by the reference measuring device (4291) and the measuring device (8753D) actually used for measurement. This procedure corresponds to a correction procedure.

(6) The measuring device (8753D) actually used for measurement performs measurement on the chip resistor.

(7) A corrected measured value is calculated with a personal computer using the measured data and the correction data.

As a result of the measurement and correction processing performed in the above-described manner, the result measured by the reference measuring device matched the value measured by the network analyzer.

FIG. 13 shows graphs of results obtained by performing the measurement and correction processing on a 1005-size chip resistor (50Ω). FIG. 13(a) shows a graph of a reference value, a measured value before correction, and a measured value after correction. The "reference value" indicates a value measured by the reference measuring device. The "measured value before correction" indicates a measured result of the measuring device actually used for measurement and is an uncorrected measured value. The "measured value after correction" indicates a value obtained by correcting the measured value of the measuring device actually used for measurement (estimated value of the measured value obtained when the value is measured by the reference measuring device). FIG. 13(b-1), FIG. 13(b-2), and FIG. 13(c) show a graph of the measured value "before correction", a graph of the measured value "after correction", and a graph of the "reference value", respectively.

Figure 13A:
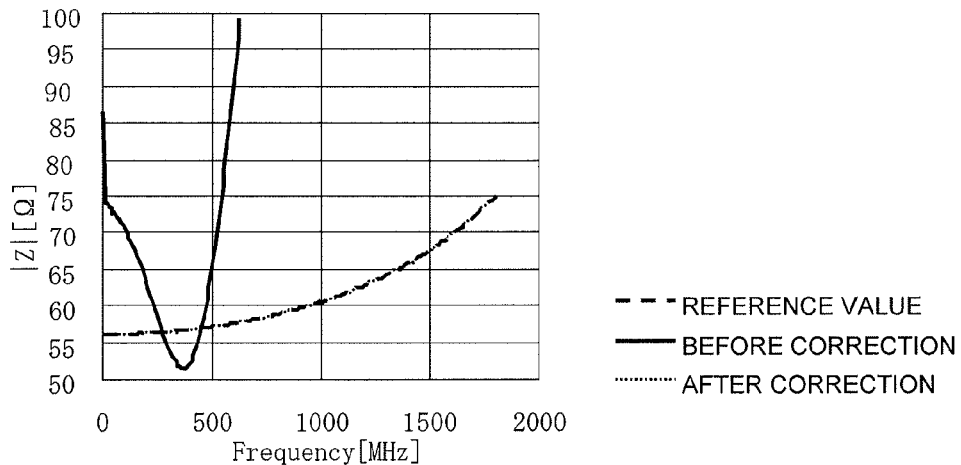
FIGS. 13(a), 13(b-1), 13(b-2) and 13(c) are graphs showing chip resistor measurement results (embodiment 2).
Figure 13A:
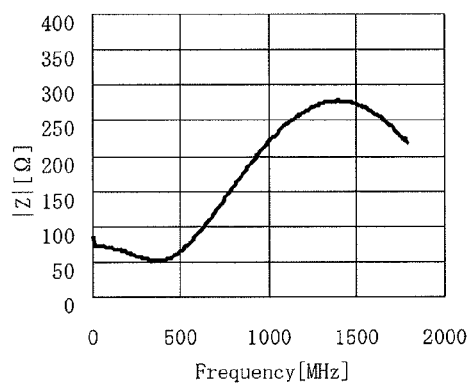
Figure 13A:
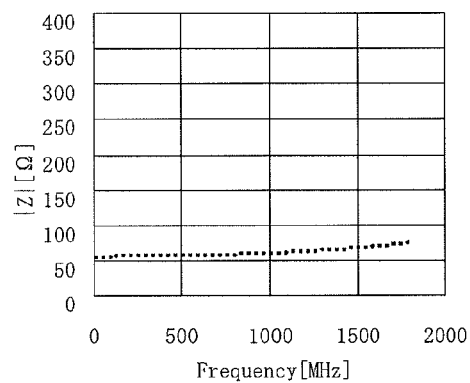
Figure 13C:
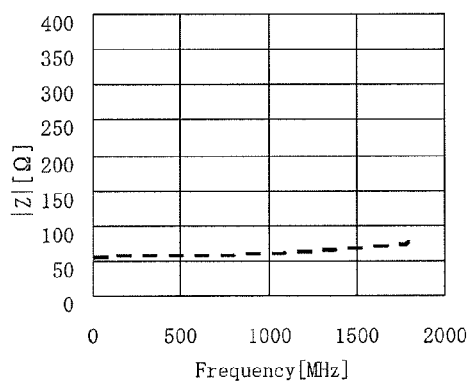

As shown in FIG. 13(a), although the "reference value" and the "value after correction" resemble like the values cannot be discriminated from one another in the drawing, the "value before correction" is significantly shifted from the "reference value". More specifically, although a measured value significantly shifted from the measured value of the reference measuring device is obtained without the correction, a measured value extremely close to the measured value of the reference measuring device can be obtained by performing the correction.

In the above-described first-type embodiment of the present invention, in a two-port measuring system for measuring a two-terminal impedance element series-connected or shunt-connected to a fixture or a probe, an electrical characteristic of each port is represented as T-type (FIG. 14) and π-type (FIG. 20) equivalent circuits and the circuit is simplified to include five errors although a reciprocal circuit is generally modeled to include six errors. In this manner, when an error of a fixture or a probe is determined, it is possible to determine the five errors values using three two-terminal impedance elements (hereinafter, referred to as standard samples) having known values identified by an impedance analyzer without grounding the standard samples in the case of series connection and without cutting a signal line in the case of shunt connection.

When the above-described error model is used, four of the errors of the fixture or the probe determined from the measured values of the three standard samples have two solutions of opposite signs. Accordingly, a correct sign combination of the four errors is determined by confirming that the three values determined from the three standard samples match the last one error for each sign combination.

However, since the values do not completely match due to a measurement variance of the three standard samples and a trace noise of a measuring device, a correct sign combination for all frequencies is determined by determining a sign combination that gives more similar values. Accordingly, if a wrong sign combination is selected due to the measurement variance and the influence of the noise, a frequency for which correction accuracy cannot be guaranteed may exist.

A method for correcting a high-frequency characteristic error of an electronic component according to a second-type embodiment of the present invention will be described next with reference to FIG. 26 to FIG. 37.

In the second-type embodiment of the present invention, selection of a sign combination performed in the first-type embodiment of the present invention is omitted by using a one-port error model equivalent to a two-port error model. Accordingly, error-correction-parameter determination accuracy and measurement-error correction accuracy improve. A detailed description will be given below.

<Balance-conversion one-port error model> A balance-conversion one-port error model used in the second-type embodiment of the present invention will be described first. The balance-conversion one-port error model is obtained by performing balance conversion of a two-port error model in a manner described below.

Figure 26:
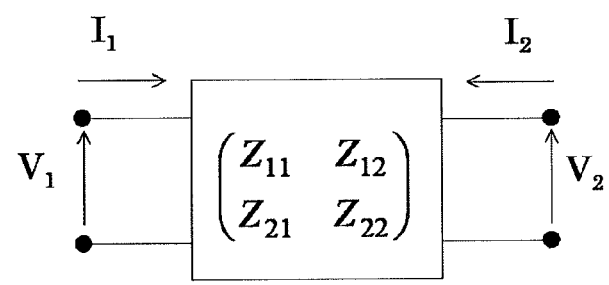
FIG. 26 is a circuit diagram showing a Z-parameter model of a two-port circuit (embodiments 3 and 4).

FIG. 26 shows a circuit diagram of a model representing a two-port circuit using Z-parameters. When a relationship shown in FIG. 26 is represented as a matrix, the following equation [Equation 11] is obtained.

$$\begin{pmatrix} V_1 \\ V_2 \end{pmatrix} = \begin{pmatrix} Z_{11} & Z_{12} \\ Z_{21} & Z_{22} \end{pmatrix} \cdot \begin{pmatrix} I_1 \\ I_2 \end{pmatrix} \quad \text{[Equation 11]}$$

Balance conversion is performed by replacing an input value as $V_c=(V_1+V_2)/2$, $I_c=(I_1+I_2)/2$ and an output value as $V_d=(V_1-V_2)/2$, $I_d=(I_1-I_2)/2$, whereby the Z-parameters are converted as shown by the following equation [Equation 12].

$$\begin{pmatrix} V_c \\ V_d \end{pmatrix} = \begin{pmatrix} Z_{cc} & Z_{cd} \\ Z_{dc} & Z_{dd} \end{pmatrix} \cdot \begin{pmatrix} I_c \\ I_d \end{pmatrix} \quad \text{[Equation 12]}$$

$$= \begin{pmatrix} \frac{1}{4}(Z_{11}+Z_{12}+Z_{21}+Z_{22}) & \frac{1}{2}(Z_{11}-Z_{12}+Z_{21}-Z_{22}) \\ \frac{1}{2}(Z_{11}+Z_{12}-Z_{21}-Z_{22}) & Z_{11}-Z_{12}-Z_{21}+Z_{22} \end{pmatrix} \cdot \begin{pmatrix} I_c \\ I_d \end{pmatrix}$$

By performing balance conversion regarding admittance parameters (hereinafter, referred to as Y-parameters), the Y-parameters are represented as the following equation [Equation 13].

$$\begin{pmatrix} I_c \\ I_d \end{pmatrix} = \begin{pmatrix} Y_{cc} & Y_{cd} \\ Y_{dc} & Y_{dd} \end{pmatrix} \cdot \begin{pmatrix} V_c \\ V_d \end{pmatrix} \quad \text{[Equation 13]}$$

$$= \begin{pmatrix} (Y_{11}+Y_{12}+Y_{21}+Y_{22}) & \frac{1}{2}(Y_{11}-Y_{12}+Y_{21}-Y_{22}) \\ \frac{1}{2}(Y_{11}+Y_{12}-Y_{21}-Y_{22}) & \frac{1}{4}Y_{11}-Y_{12}-Y_{21}+Y_{22} \end{pmatrix} \cdot \begin{pmatrix} V_c \\ V_d \end{pmatrix}$$

Since a reciprocity theorem is generally satisfied in a passive circuit, the Z-parameter and the Y-parameter are represented as $Z_{12}=Z_{12}$ and $Y_{12}=Y_{21}$. Accordingly, the Z-parameter and the Y-parameter can be represented as T-type and π-type equivalent circuits.

Figure 27:
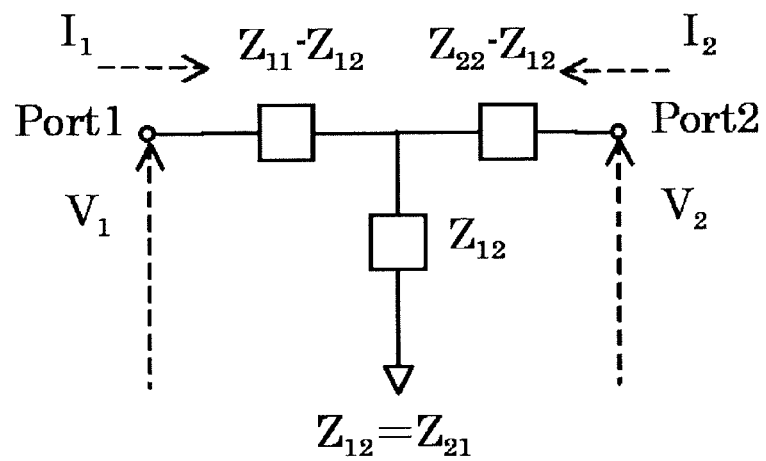
FIG. 27 is a circuit diagram showing a T-type equivalent circuit of a circuit shown in FIG. 25 (embodiments 3 and 4).
Figure 28:
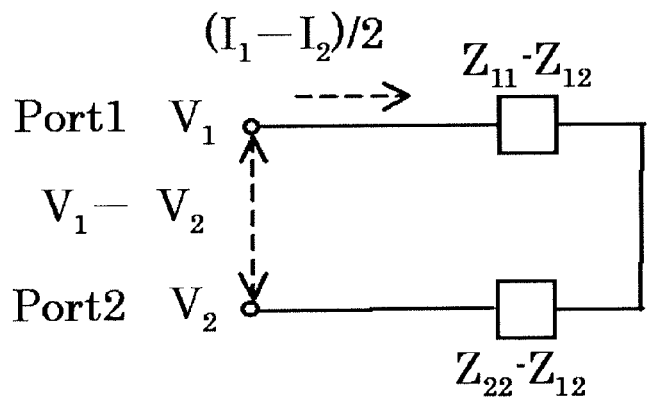
FIG. 28 is a circuit diagram showing an equivalent circuit of a circuit shown in FIG. 26 at the time of input of a differential signal (embodiments 3 and 4).

When the Z-parameter shown in FIG. 26 and the equation [Equation 11] is converted into a T-type equivalent circuit, a circuit diagram shown in FIG. 27 is obtained. When the circuit shown in FIG. 27 is modified into an equivalent circuit used at the time of input of a differential signal, a circuit diagram shown in FIG. 28 is obtained. A serial impedance component $(Z_{11}-Z_{12})+(Z_{22}-Z_{12})$ of ports 1 and 2 of the T-type equivalent circuit corresponds to $Z_{dd}$ of the equation [Equation 12].

By utilizing this fact, when a two-terminal impedance element is series-connected, a correction model is configured in the following manner.

Figure 29:
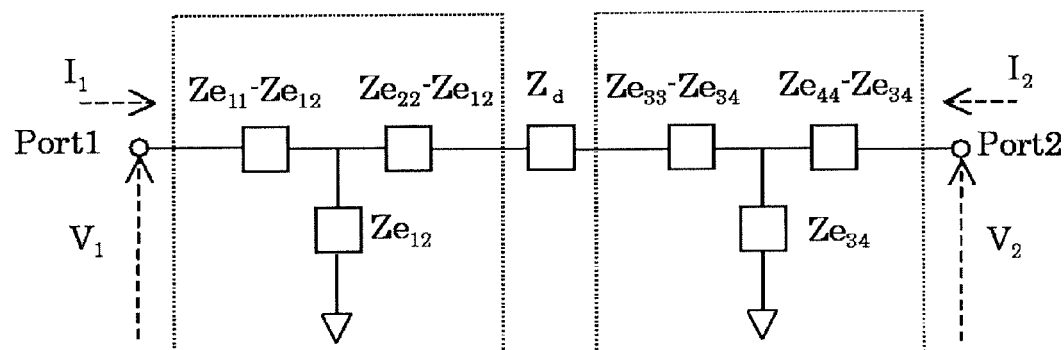
FIG. 29 is a circuit diagram showing a T-type equivalent circuit of Z-parameters of a two-port error model (embodiment 3).

FIG. 29 is a circuit diagram showing a two-port error model employed when a series-connected two-terminal impedance element is measured using a fixture as a T-type equivalent circuit. A part enclosed by a dotted line is the two-port error model. The two-port error model is connected between two ports (port 1 and port 2) at which impedance $Z_d$ of an electronic component is measured by a reference measuring system and impedance of the electronic component is measured by an actual measuring system.

Figure 30:
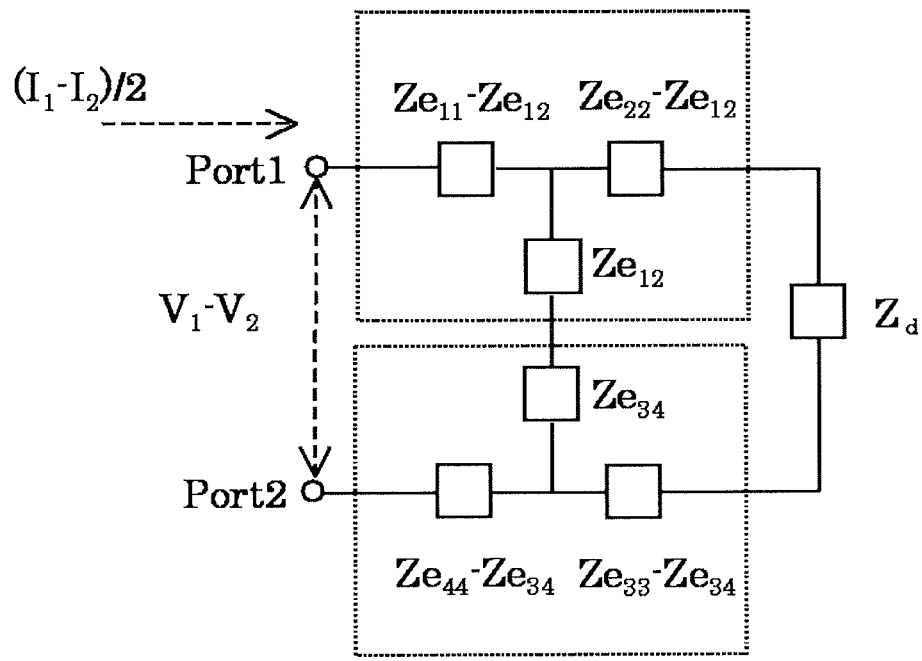
FIG. 30 is a circuit diagram showing an equivalent circuit of a circuit shown in FIG. 28 at the time of input of a differential signal (embodiment 3).

As in the case shown in FIG. 28, when the circuit shown in FIG. 29 is modified into an equivalent circuit used at the time of input of a differential signal, a circuit diagram shown in FIG. 30 is obtained.

When serial impedance between ports 1 and 2 of the circuit shown in FIG. 30 is determined, the following equation [Equation 14] is obtained.

$$Zt_{dd} = Ze_{11} - Ze_{12} + Ze_{44} - Ze_{34} + \quad \text{[Equation 14]}$$
$$\frac{(Ze_{22} - Ze_{12} + Ze_{33} - Ze_{34} + Z_d) \times (Ze_{12} + Ze_{34})}{Ze_{22} - Ze_{12} + Ze_{33} - Ze_{34} + Z_d + Ze_{12} + Ze_{34}}$$

This equation [Equation 14] is equivalent to a differential impedance component $Zt_{dd}$ of the Z-parameters obtained by measuring the series-connected two-terminal impedance element using a fixture. More specifically, the equation [Equation 14] associates impedance obtained when the electronic component is measured by two ports of the actual measuring system with impedance $Z_d$ obtained when the electronic component is measured by the reference measuring system through a two-port error model. In addition, the equation [Equation 14] indicates that the circuit shown in FIG. 30 is equivalent to a circuit shown in FIG. 31.

Figure 31:
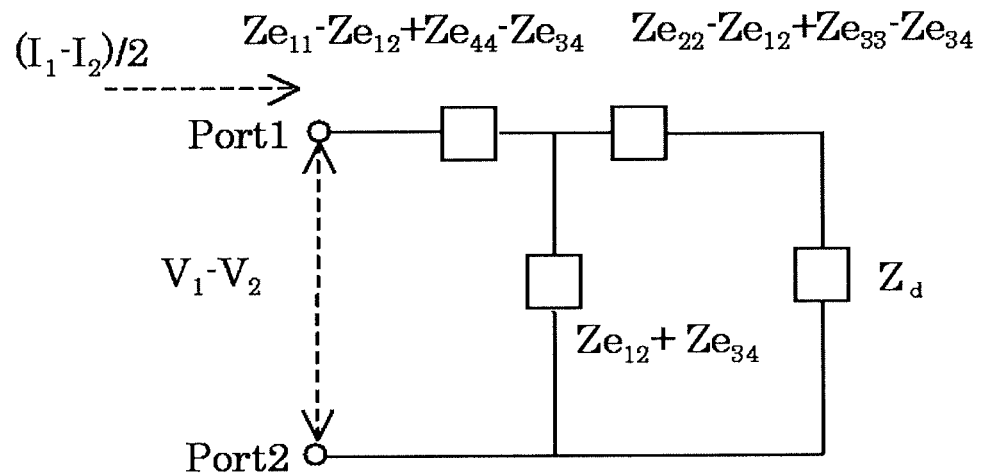
FIG. 31 is a circuit diagram showing an equivalent circuit of a circuit shown in FIG. 29 (embodiment 3).

In FIG. 31, by integrating impedance components of the circuit into three, the circuit is equivalent to the one-port error model representing errors of the fixture as a T-type equivalent circuit. This indicates that impedance of DUT can be determined in the case of series connection by performing measurement/correction according to steps (1) to (4) described below.

(1) Z-parameters are measured using a fixture regarding three correction samples (chip resistors or the like) having known characteristics (impedance) or three correction samples that can be considered to have high-frequency characteristics equivalent to those of the three correction samples. A network or impedance analyzer is used in the measurement.

(2) Balance conversion of the Z-parameters is performed to extracts the differential impedance component $Z_{dd}$ thereof.

(3) Three error components of the fixture that are integrated as the circuit shown in FIG. 30, which is an equivalent circuit of the differential impedance component, are calculated based on $Z_{dd}$ obtained when the three correction samples are measured and the "known characteristics (impedance) of the three correction samples".

(4) The impedance $Z_d$ of the DUT is calculated "by eliminating the three error components calculated at the step (3)" from $Z_{dd}$ obtained when the DUT is measured.

Although each value is not determined independently when the error Z-parameters of the fixture shown in FIG. 29 are integrated as shown in FIG. 31, this does not cause any problem in execution of the correction.

When a two-terminal impedance element is shunt-connected, the following correction model is obtained.

Regarding a shunt-connected two-terminal impedance element, Y-parameters are converted into a π-type equivalent circuit and a common-mode admittance component is used, whereby the error model can be handled as one-port correction model as in the case of series connection.

Figure 32:
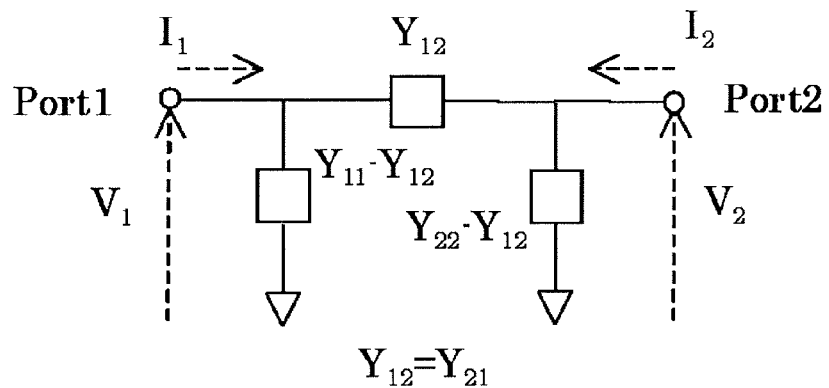
FIG. 32 is a diagram showing a π-type equivalent circuit (embodiment 4).
Figure 33:
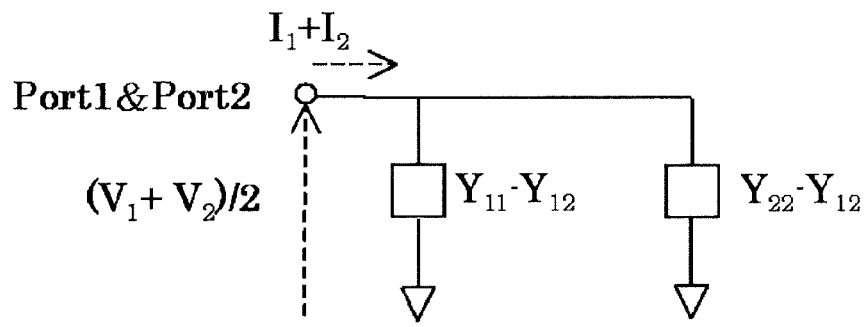
FIG. 33 is a circuit diagram showing an equivalent circuit of a circuit shown in FIG. 31 at the time of input of a common-mode signal (embodiment 4).

FIG. 32 shows a circuit diagram of a π-type equivalent circuit using Y-parameters. When the circuit shown in FIG. 32 is modified into an equivalent circuit used at the time of input of a common-mode signal, a parallel admittance component of ports 1 and 2 of the π-type equivalent circuit corresponds to $Y_{cc}$ of the equation [Equation 13].

As in the case of series connection, a two-port error model used when a shunt-connected two-terminal impedance element is measured using a fixture is represented using a π-type equivalent circuit. A part enclosed by a dotted line is the two-port error model. The two-port error model is connected between two ports (port 1 and port 2) at which admittance $Y_d$ is measured by a reference measuring system and admittance is measured by an actual measuring system. As described before, when the circuit shown in FIG. 34 is modified into an equivalent circuit used at the time of input of a common-mode signal, a circuit diagram shown in FIG. 35 is obtained.

Figure 35:
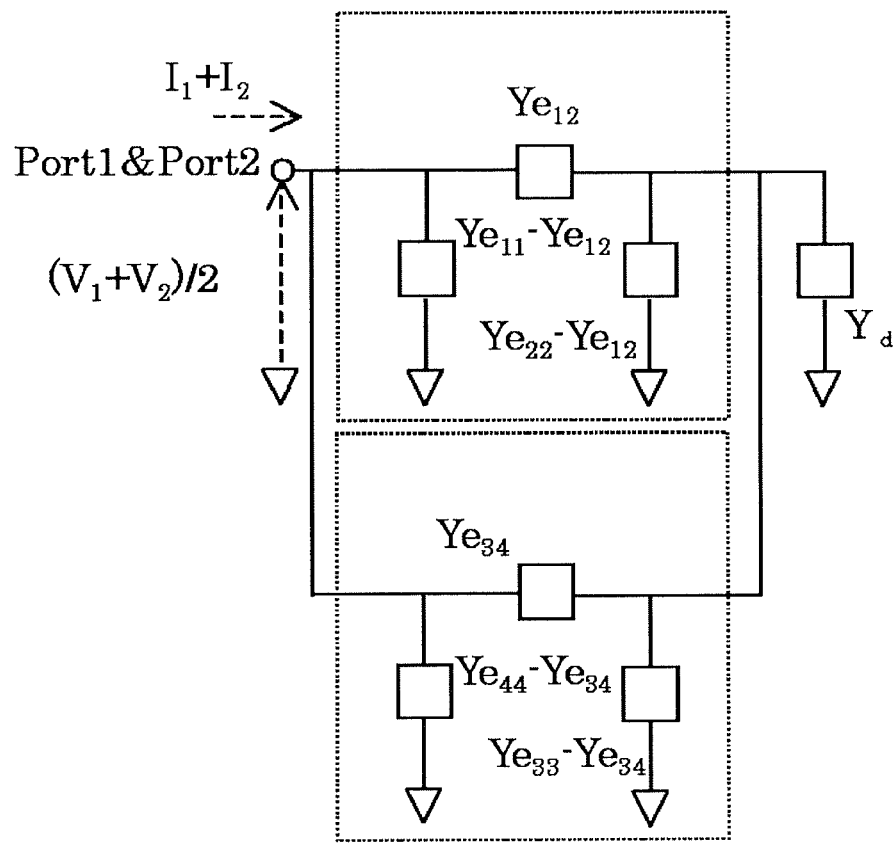
FIG. 35 is a circuit diagram showing an equivalent circuit of a circuit shown in FIG. 33 at the time of input of a common-mode signal (embodiment 4).

When parallel impedance between ports 1 and 2 of the circuit shown in FIG. 35 is determined, the following equation [Equation 15] is determined.

$$Yt_{dd} = Ye_{11} - Ye_{12} + Ye_{44} - Ye_{34} + \frac{(Ye_{22} - Ye_{12} + Ye_{33} - Ye_{34} + Y_d) \times (Ye_{12} + Ye_{34})}{Ye_{22} - Ye_{12} + Ye_{33} - Ye_{34} + Y_d + Ye_{12} + Ye_{34}}$$ [Equation 15]

Figure 34:
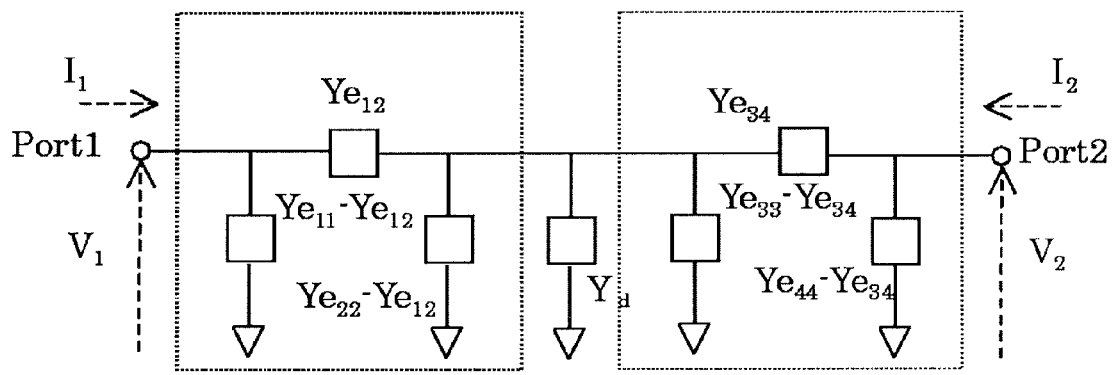
FIG. 34 is a circuit diagram showing a π-type equivalent circuit of Y-parameters of a two-port error model (embodiment 4).

The equation [Equation 15] is equivalent to a common-mode admittance component $Yt_{dd}$ of the Y-parameters obtained by measuring the shunt-connected two-terminal impedance element using the fixture. More specifically, the equation [Equation 15] associates the admittance obtained when an electronic component is measured by two ports of an actual measuring system with the admittance $Y_d$ obtained when the electronic component is measured by a reference measuring system through a two-port error model. In addition, the equation [Equation 15] indicates that the circuit shown in FIG. 34 is equivalent to the circuit shown in FIG. 35.

In FIG. 35, by integrating admittance components of the circuit into three, the circuit is equivalent to the one-port error model representing errors of the fixture as a π-type equivalent circuit. This indicates that admittance of the DUT can be determined, as in the case of series-connected T-type equivalent circuit, by performing the one-port correction on the common-mode admittance component after performing the balance conversion of the Y-parameters measured using the fixture.

<Embodiment 3> A measurement-error correction procedure employed when a two-terminal impedance element is series-connected in an actual measuring system will be described.

Values of three kinds of two-terminal two-port devices (appropriate chip resistors or devices can be used) are previously identified by an impedance analyzer or a network analyzer using the TRL calibration method or the RRRR calibration method (hereinafter, referred to as standard two-port devices). This procedure has to be performed. This measurement is performed in the reference measuring system.

The standard two-port samples or samples that can be considered to have high-frequency characteristics equivalent to the standard two-port samples are then connected to two ports of an actual measuring system. S-parameters are measured.

The S-parameter measurement result is then converted into a differential Z-parameter using the following equation [Equation 16]. This equation [Equation 16] can be determined by converting the Z-parameters of the right side of the above-described equation [Equation 14] into the S-parameters.

$$Z_{dd} = \frac{2 \times Z_0 \times (S_{M21} + S_{M12} + S_{M11} \times S_{M22} - S_{M21} \times S_{M12} - 1)}{S_{M11} + S_{M22} + S_{M21} \times S_{M12} - S_{M11} \times S_{M22} - 1}$$ [Equation 16]

Here, $S_M$: S-parameter measurement result of the actual two-port measuring system $Z_{dd}$: converted differential Z-parameter $Z_0$: characteristic impedance of the measuring system A relationship between the known values of the standard two-port samples and the converted differential Z-parameter is then represented using a one-port error model. The one-port error model may be represented by converting and modeling the relationship into reflection coefficients instead of FIG. 31.

Error parameters of the one-port error model are calculated from the relationship between the known impedance values of the three standard two-port samples and the converted differential Z-parameter. When the one-port error model shown in FIG. 31 is used, three unknown values shown as the error parameters in FIG. 31, namely, $Ze_{11}-Ze_{12}+Ze_{44}-Ze_{34}$, $Ze_{22}-Ze_{12}+Ze_{33}-Ze_{34}$, and $Ze_{12}+Ze_{34}$, are determined.

A value obtained by measuring another two-terminal two-port device by the actual measuring system is corrected using the one-port error model that uses the calculated error parameter values to obtain a true value of the other two-terminal two-port device (i.e., an estimated value of the measured value that may be obtained when the device is measured by the reference measuring system).

As described above, by replacing the relationship of the known values of the standard two-port samples with the one-port error model by applying the balance conversion on the actual two-port measuring system, whereby error parameters are uniquely determined.

According to this method, since a problem that error parameters are not uniquely determined as in an AAA correction method (embodiment 1) does not occur, an influence of a measurement variable and a trace noise of the measuring device onto the error-parameter determination process is suppressed.

Accordingly, the error-parameter determination accuracy and the correction accuracy improve compared to the AAA correction method (embodiment 1).

<Embodiment 4> A measurement error correction procedure employed when a two-terminal impedance element is shunt-connected in an actual measuring system will be described.

Values of three kinds of two-terminal two-port devices (appropriate chip resistors or devices can be used) are previously identified by an impedance analyzer or a network analyzer using the TRL calibration method or the RRRR calibration method (hereinafter, referred to as standard two-port devices). This procedure has to be performed. This measurement is performed in the reference measuring system.

The standard two-port samples are then connected to the two-port actual measuring system to measure S-parameters.

The S-parameter measurement result is then converted into a common-mode Y-parameter using the following equation [Equation 17]. This equation [Equation 17] is determined by converting the Y-parameters of the right side of the above-described equation [Equation 15] into the S-parameters.

$$Y_{cc} = \frac{2 \times (-S_{M21} - S_{M12} + S_{M21} \times S_{M12} - S_{M11} \times S_{M22} - 1)}{Z_0 \times (S_{M11} + S_{M22} + S_{M11} \times S_{M22} - S_{M12} \times S_{M21} - 1)}$$

[Equation 17]

Here, $S_M$: S-parameter measurement result of the actual two-port measuring system $Y_{dd}$: converted common-mode Y-parameter $Z_0$: characteristic impedance of the measuring system p A relationship between the known values of the standard two-port samples and the converted common-mode Y-parameter is then represented using a one-port error model. The one-port error model may be represented by converting and modeling the relationship into reflection coefficients instead of FIG. 36.

Figure 36:
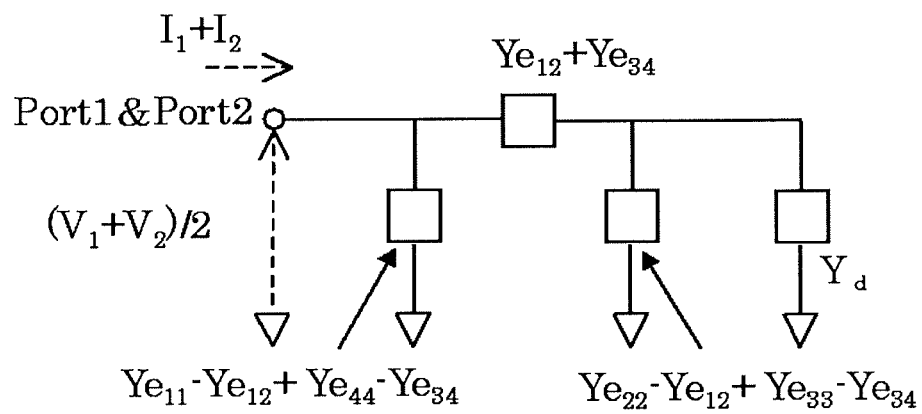
FIG. 36 is a circuit diagram showing an equivalent circuit of a circuit shown in FIG. 34 (embodiment 4).

Error parameters of the one-port error model are calculated from the relationship between the known admittance values of the three standard two-port samples and the converted common-mode Z-parameter. When the one-port error model shown in FIG. 36 is used, three unknown values shown as the error parameters in FIG. 36, namely, $Ye_{12}+Ye_{34}, Ye_{11}-Ye_{12}+Ye_{44}-YE_{34}, Ye_{22}-Ye_{12}+Ye_{33}-Ye_{44}$, are determined.

A value obtained by measuring another two-terminal two-port device by the actual measuring system is corrected using the one-port error model that uses the calculated error parameter values to obtain a true value of the other two-terminal two-port device (i.e., an estimated value of the measured value that may be obtained when the device is measured by the reference measuring system).

As described above, by replacing the relationship of the known values of the standard two-port samples with the one-port error model by applying the balance conversion on the actual two-port measuring system, whereby error parameters are uniquely determined.

According to this method, since a problem that error parameters are not uniquely determined as in an AAA correction method (embodiment 1) does not occur, an influence of a measurement variable and a trace noise of the measuring device onto the error-parameter determination process is suppressed.

Accordingly, the error-parameter determination accuracy and the correction accuracy improve compared to the AAA correction method (embodiment 1).

Figure 37:
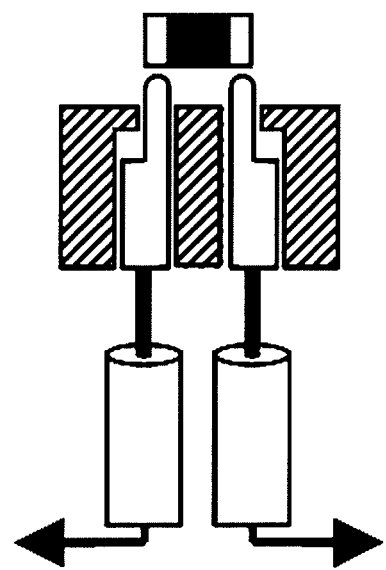
FIG. 37 is a configuration diagram of a two-port probe (embodiment 3).

<Specific Example> A configuration diagram of FIG. 37 shows a configuration of a two-port probe used in measurement. Other experimental conditions are as shown below. Series connection is employed as the connection method.

[DUT] Two kinds of 1608-size chip resistors for correction accuracy check (100Ω and 392Ω)

[Measuring Device] E8364B (Agilent Technologies, Inc.)

[Measurement Frequency] 50 MHz-1.8 GHz

[Measurement Points] 801

[Intermediate Frequency] 300 Hz

[Correction Samples] Three kinds of 1608-size resistors (1.2Ω, 47Ω, and 560Ω) whose values are identified by an impedance analyzer 4291A (Agilent Technologies, Inc.)

Table 3 shows a result of correcting the chip resistors (100Ω and 392Ω) using the method described in the embodiment 3 that uses the one-port error model shown in FIG. 31 and the AAA correction (embodiment 1).

TABLE 3

Comparison of correction errors

| | | 100 Ω correction error | | | | 392 Ω correction error | | | |
|---|---|---|---|---|---|---|---|---|---|
| | | resistance | | reactance | | resistance | | reactance | |
| | | avg. | 3σ | avg. | 3σ | avg. | 3σ | avg. | 3σ |
| AAA correction method | port 1 | 0.082 | 0.448 | 0.274 | 0.598 | 1.774 | 3.281 | 0.136* | 3.245 |
| | port 2 | 0.156 | 0.463 | −0.221 | 0.496 | 0.596 | 3.166 | 0.612 | 3.187 |
| this method | | 0.048* | 0.414* | 0.058* | 0.427* | 0.589* | 3.05* | 0.187 | 3.03* |

Table 3 shows an average and 3σ of the correction errors. "*" is attached to the smallest correction error. All of the correction errors of this method show the smallest values excluding the average of the reactance of 392Ω. In addition, average values of the correction errors determined from a measured value $S_{11}$ of the port 1 and a measured value $S_{22}$ of the port 2 in the AAA correction method differs from one another. Accordingly, Table 3 indicates that the method according to the embodiment 3 can correct the error more accurately than the AAA correction method (embodiment 1).

<Conclusion> The use of the above-described error correction methods allow a calibration work to be performed in using the same correction-target measuring system as that used at the time of actual measurement. Accordingly, an automatic characteristic selector that substantially permits mass-produced devices or samples having substantially the same size/shape as the mass-produced devices to be connected to a measurement terminal section can correct an error of a measuring system.

The present invention is not limited to the above-described embodiments and can be carried out by making various modifications.

For example, the present invention is not limitedly applied to a measuring system using a measurement board but can be applied to a measuring system using measurement pins.

The invention claimed is:

1. An electronic-component high-frequency characteristic error correcting method for calculating, on the basis of a result obtained by measuring a two-terminal impedance electronic component by an actual measuring system, an estimated frequency characteristic value of the electronic component obtained when the electronic component is measured by a reference measuring system, the method comprising:
   a first step of preparing at least three first correction data acquisition samples having different frequency characteristics, values of the at least three first correction data acquisition samples being identified by the reference measuring system;
   a second step of measuring the at least three first correction data acquisition samples or at least three second correction data acquisition samples that have frequency characteristics equivalent to the at least three first correction data acquisition samples by the actual measuring system;
   a third step of determining an equation that associates an actual value measured by the actual measuring system with a reference value measured by the reference measuring system using an error correction coefficient of a transmission line on the basis of the values of the first correction data acquisition samples prepared at the first step and the values of the first correction data acquisition samples or the second correction data acquisition samples measured by the actual measuring system at the second step;
   a fourth step of measuring a given electronic component by the actual measuring system;
   a fifth step of calculating, using the equation determined at the third step, an estimated frequency characteristic value of the electronic component obtained when the electronic component is measured by the reference measuring system on the basis of the measured result obtained at the fourth step,
   wherein the first correction data acquisition sample and the electronic component or the first correction data acquisition sample, the second correction data acquisition sample, and the electronic component are series-connected in the actual measuring system, and
   wherein the equation is determined on the basis of error models that are connected between terminals $1_m$ and $2_m$ where impedance $Z_m$ of the electronic component is measured by the reference measuring system and terminals $1_d$ and $2_d$ where impedance $Z_d$ of the electronic component is measured by the actual measuring system, respectively, and
   wherein, when impedance viewed from the terminal $1_m$ is calculated, impedance $Z_{11}$ and $Z_f$ are connected between the terminal $1_m$ and the terminal $1_d$ in series, impedance $Z_{12}$ is connected between ground and a connection point of the impedance $Z_{11}$ and $Z_f$, impedance $Z_{21}$ is connected between the terminal $2_d$ and the terminal $2_m$, and impedance $Z_{22}$ is connected between the terminal $2_d$ and ground in the error models, and the impedance $Z_f$, $Z_{11}$, $Z_{12}$, $Z_{21}$, and $Z_{22}$ are determined using at least one combination that gives matching $Z_{f1}$, $Z_{f2}$, and $Z_{f3}$ regarding a following equation [Equation 2]

$$Z_{f1} = -\left[\begin{array}{c}\left\{\begin{array}{c}(Z_{22}+(Z_{21}+Z_0))Z_{d1}+\\((Z_{21}+Z_0)+Z_{12})Z_{22}+\\Z_{12}(Z_{21}+Z_0)\end{array}\right\}Z_{m11}+\\\left\{\begin{array}{c}(-Z_{12}-Z_{11})Z_{22}+\\(-Z_{12}-Z_{11})(Z_{21}+Z_0)\end{array}\right\}Z_{d1}+\\\left\{\begin{array}{c}(-Z_{12}-Z_{11})\\(Z_{21}+Z_0)-Z_{11}Z_{12}\end{array}\right\}Z_{22}-\\Z_{11}Z_{12}(Z_{21}+Z_0)\end{array}\right] \bigg/ \left[\begin{array}{c}\{(Z_{22}+(Z_{21}+Z_0)\}Z_{m11}+\\(-Z_{12}-Z_{11})Z_{22}+\\(-Z_{12}-Z_{11})(Z_{21}+Z_0)\end{array}\right]$$ [Equation 2]

$$Z_{f2} = -\left[\begin{array}{c}\left\{\begin{array}{c}(Z_{22}+(Z_{21}+Z_0))Z_{d2}+\\((Z_{21}+Z_0)+Z_{12})Z_{22}+\\Z_{12}(Z_{21}+Z_0)\end{array}\right\}Z_{m12}+\\\left\{\begin{array}{c}(-Z_{12}-Z_{11})Z_{22}+\\(-Z_{12}-Z_{11})(Z_{21}+Z_0)\end{array}\right\}Z_{d2}+\\\left\{\begin{array}{c}(-Z_{12}-Z_{11})\\(Z_{21}+Z_0)-Z_{11}Z_{12}\end{array}\right\}Z_{22}-\\Z_{11}Z_{12}(Z_{21}+Z_0)\end{array}\right] \bigg/ \left[\begin{array}{c}\{(Z_{22}+(Z_{21}+Z_0)\}Z_{m12}+\\(-Z_{12}-Z_{11})Z_{22}+\\(-Z_{12}-Z_{11})(Z_{21}+Z_0)\end{array}\right]$$

$$Z_{f3} = -\left[\begin{array}{c}\left\{\begin{array}{c}(Z_{22}+(Z_{21}+Z_0))Z_{d3}+\\((Z_{21}+Z_0)+Z_{12})Z_{22}+\\Z_{12}(Z_{21}+Z_0)\end{array}\right\}Z_{m13}+\\\left\{\begin{array}{c}(-Z_{12}-Z_{11})Z_{22}+\\(-Z_{12}-Z_{11})(Z_{21}+Z_0)\end{array}\right\}Z_{d3}+\\\left\{\begin{array}{c}(-Z_{12}-Z_{11})\\(Z_{21}+Z_0)-Z_{11}Z_{12}\end{array}\right\}Z_{22}-\\Z_{11}Z_{12}(Z_{21}+Z_0)\end{array}\right] \bigg/ \left[\begin{array}{c}\{(Z_{22}+(Z_{21}+Z_0)\}Z_{m13}+\\(-Z_{12}-Z_{11})Z_{22}+\\(-Z_{12}-Z_{11})(Z_{21}+Z_0)\end{array}\right]$$

among 16 combinations of $Z_{11}$, $Z_{12}$, $Z_{21}$, and $Z_{22}$ obtained on the basis of a following equation [Equation 1a]

$$denom = (Z_{d2}-Z_{d1})Z_{m13} + (Z_{d1}-Z_{d3})Z_{m12} + (Z_{d3}-Z_{d2})Z_{m11}$$ [Equation 1a]

$$Z_{11} = \left[\begin{array}{ccc}\pm\sqrt{Z_{d2}-Z_{d1}} & \sqrt{Z_{d3}-Z_{d1}} \\ \sqrt{Z_{d3}-Z_{d2}} & \sqrt{Z_{m12}-Z_{m11}} \\ \sqrt{Z_{m13}-Z_{m11}} & \sqrt{Z_{m13}-Z_{m12}}\end{array} - \left\{\begin{array}{c}(Z_{d3}-Z_{d2})Z_{m12}Z_{m13}+\\(Z_{d1}-Z_{d3})Z_{m11}Z_{m13}+\\(Z_{d2}-Z_{d1})Z_{m11}Z_{m12}\end{array}\right\}\right] \bigg/ denom$$

$$Z_{12} = \pm\sqrt{\frac{(Z_{d2}-Z_{d1})(Z_{d3}^2+(-Z_{d2}-Z_{d1})Z_{d3}+Z_{d1}Z_{d2})}{(Z_{m12}-Z_{m11})(Z_{m13}^2+(-Z_{m12}-Z_{m11})Z_{m13}+Z_{m11}Z_{m12})}} \bigg/ denom$$

and a following equation [Equation 1b]

$$denom = (Z_{d2}-Z_{d1})Z_{m23} + (Z_{d1}-Z_{d3})Z_{m22} + (Z_{d3}-Z_{d2})Z_{m21}$$ [Equation 1b]

$$Z_{21} = \left[\begin{array}{ccc}\pm\sqrt{Z_{d2}-Z_{d1}} & \sqrt{Z_{d3}-Z_{d1}} \\ \sqrt{Z_{d3}-Z_{d2}} & \sqrt{Z_{m22}-Z_{m21}} \\ \sqrt{Z_{m23}-Z_{m21}} & \sqrt{Z_{m23}-Z_{m22}}\end{array} - \left\{\begin{array}{c}(Z_{d3}-Z_{d2})Z_{m22}Z_{m23}+\\(Z_{d1}-Z_{d3})Z_{m21}Z_{m23}+\\(Z_{d2}-Z_{d1})Z_{m21}Z_{m22}\end{array}\right\}\right] \bigg/ denom$$

-continued $$Z_{22} = \pm \sqrt{\frac{(Z_{d2} - Z_{d1})(Z_{d3}^2 + (-Z_{d2} - Z_{d1})Z_{d3} + Z_{d1}Z_{d2})}{(Z_{m22} - Z_{m21})(Z_{m23}^2 + (-Z_{m22} - Z_{m21})Z_{m23} + Z_{m21}Z_{m22})}} \Big/ denom$$

using results $Z_{d1}$, $Z_{d2}$, and $Z_{d3}$ obtained by measuring impedance of the at least three first correction data acquisition samples at the first step, and results $Z_{m11}$, $Z_{m12}$, and $Z_{m13}$ obtained by measuring impedance of the terminal $1_m$ and results $Z_{m21}$, $Z_{22}$, and $Z_{m23}$ obtained by measuring impedance of the terminal $2_m$ regarding the at least three first correction data acquisition samples or the second correction data acquisition samples at the second step.

2. An electronic-component high-frequency characteristic error correcting method for calculating, on the basis of a result obtained by measuring a two-terminal impedance electronic component by an actual measuring system, an estimated frequency characteristic value of the electronic component obtained when the electronic component is measured by a reference measuring system, the method comprising:

a first step of preparing at least three first correction data acquisition samples having different frequency characteristics, values of the at least three first correction data acquisition samples being identified by the reference measuring system;

a second step of measuring the at least three first correction data acquisition samples or at least three second correction data acquisition samples that have frequency characteristics equivalent to the at least three first correction data acquisition samples by the actual measuring system;

a third step of determining an equation that associates an actual value measured by the actual measuring system with a reference value measured by the reference measuring system using an error correction coefficient of a transmission line on the basis of the values of the first correction data acquisition samples prepared at the first step and the values of the first correction data acquisition samples or the second correction data acquisition samples measured by the actual measuring system at the second step;

a fourth step of measuring a given electronic component by the actual measuring system;

a fifth step of calculating, using the equation determined at the third step, an estimated frequency characteristic value of the electronic component obtained when the electronic component is measured by the reference measuring system on the basis of the measured result obtained at the fourth step, wherein the first correction data acquisition sample and the electronic component or the first correction data acquisition sample, the second correction data acquisition sample, and the electronic component are shunt-connected in the actual measuring system, and wherein the equation is determined on the basis of error models that are connected between terminals $1_m$ and $2_m$ where admittance $Y_m$ of the electronic component is measured by the reference measuring system and terminals $1_d$ and $2_d$ where admittance $Y_d$ of the electronic component is measured by the actual measuring system, respectively, and wherein, when admittance viewed from the terminal $1_m$ is calculated, admittance $Y_{12}$ is connected between the terminal $1_m$ and the terminal $1_d$, admittance $Y_{11}$ is connected between ground and a connection point of the terminal $1_m$ and the admittance $Y_{12}$, admittance $Y_f$ is connected between ground and a connection point of the admittance $Y_{12}$ and the terminal $1_d$, admittance $Y_{22}$ is connected between the terminal $2_d$ and the terminal $2_m$, and admittance $Y_{21}$ is connected between ground and a connection point of the admittance $Y_{22}$ and the terminal $2_m$ in the error models, and the admittance $Y_f$, $Y_{11}$, $Y_{12}$, $Y_{21}$, and $Y_{22}$ are determined using at least one combination that gives matching $Y_{f1}$, $Y_{f2}$, and $Y_{f3}$ regarding a following equation [Equation 4]

$$Y_{f1} = -\begin{bmatrix} \begin{Bmatrix} Y_{22} + (Y_{21} + Y_0))Y_{d1} + \\ ((Y_{21} + Y_0) + Y_{12})Y_{22} + \\ Y_{12}(Y_{21} + Y_0) \end{Bmatrix} Y_{m11} + \\ \begin{Bmatrix} (-Y_{12} - Y_{11})Y_{22} + \\ (-Y_{12} - Y_{11})(Y_{21} + Y_0) \end{Bmatrix} Y_{d1} + \\ \begin{Bmatrix} (-Y_{12} - Y_{11}) \\ (Y_{21} + Y_0) - Y_{11}Y_{12} \end{Bmatrix} Y_{22} - \\ Y_{11}Y_{12}(Y_{21} + Y_0) \end{bmatrix} \Big/ \begin{bmatrix} \{(Y_{22} + (Y_{21} + Y_0)\}Y_{m11} + \\ (-Y_{12} - Y_{11})Y_{22} + \\ (-Y_{12} - Y_{11})(Y_{21} + Y_0) \end{bmatrix}$$ [Equation 4]

$$Y_{f2} = -\begin{bmatrix} \begin{Bmatrix} (Y_{22} + (Y_{21} + Y_0))Y_{d2} + \\ ((Y_{21} + Y_0) + Y_{12})Y_{22} + \\ Y_{12}(Y_{21} + Y_0) \end{Bmatrix} Y_{m12} + \\ \begin{Bmatrix} (-Y_{12} - Y_{11})Y_{22} + \\ (-Y_{12} - Y_{11})(Y_{21} + Y_0) \end{Bmatrix} Y_{d2} + \\ \begin{Bmatrix} (-Y_{12} - Y_{11}) \\ (Y_{21} + Y_0) - Y_{11}Y_{12} \end{Bmatrix} Y_{22} - \\ Y_{11}Y_{12}(Y_{21} + Y_0) \end{bmatrix} \Big/ \begin{bmatrix} \{(Y_{22} + (Y_{21} + Y_0)\}Y_{m12} + \\ (-Y_{12} - Y_{11})Y_{22} + \\ (-Y_{12} - Y_{11})(Y_{21} + Y_0) \end{bmatrix}$$

$$Y_{f3} = -\begin{bmatrix} \begin{Bmatrix} (Y_{22} + (Y_{21} + Y_0))Y_{d3} + \\ ((Y_{21} + Y_0) + Y_{12})Y_{22} + \\ Y_{12}(Y_{21} + Y_0) \end{Bmatrix} Y_{m13} + \\ \begin{Bmatrix} (-Y_{12} - Y_{11})Y_{22} + \\ (-Y_{12} - Y_{11})(Y_{21} + Y_0) \end{Bmatrix} Y_{d3} + \\ \begin{Bmatrix} (-Y_{12} - Y_{11}) \\ (Y_{21} + Y_0) - Y_{11}Y_{12} \end{Bmatrix} Y_{22} - \\ Y_{11}Y_{12}(Y_{21} + Y_0) \end{bmatrix} \Big/ \begin{bmatrix} \{(Y_{22} + (Y_{21} + Y_0)\}Y_{m13} + \\ (-Y_{12} - Y_{11})Y_{22} + \\ (-Y_{12} - Y_{11})(Y_{21} + Y_0) \end{bmatrix}$$

among 16 combinations of $Y_{11}$, $Y_{12}$, $Y_{21}$, and $Y_{22}$ obtained on the basis of a following equation [Equation 3a]

$$denom = (Y_{d2} - Y_{d1})Y_{m13} + $$ [Equation 3a]

$$(Y_{d1} - Y_{d3})Y_{m12} + (Y_{d3} - Y_{d2})Y_{m11}$$

$$Y_{11} = \pm \begin{bmatrix} \pm \sqrt{Y_{d2} - Y_{d1}} \sqrt{Y_{d3} - Y_{d1}} \\ \sqrt{Y_{d3} - Y_{d2}} \sqrt{Y_{m12} - Y_{m11}} \\ \sqrt{Y_{m13} - Y_{m11}} \sqrt{Y_{m13} - Y_{m12}} \end{bmatrix} - \begin{Bmatrix} (Y_{d3} - Y_{d2}) \\ Y_{m12}Y_{m13} + \\ (Y_{d1} - Y_{d3}) \\ Y_{m11}Y_{m13} + \\ (Y_{d2} - Y_{d1}) \\ Y_{m11}Y_{m12} \end{Bmatrix} \Big/ denom$$

$$Y_{12} = \pm \sqrt{\frac{(Y_{d2} - Y_{d1})(Y_{d3}^2 + (-Y_{d2} - Y_{d1})Y_{d3} + Y_{d1}Y_{d2})}{(Y_{m12} - Y_{m11})(Y_{m13}^2 + (-Y_{m12} - Y_{m11})Y_{m13} + Y_{m11}Y_{m12})}} \Big/ denom$$

and a following equation [Equation 3b]

$$denom = (Y_{d2} - Y_{d1})Y_{m23} + (Y_{d1} - Y_{d3})Y_{m22} + (Y_{d3} - Y_{d2})Y_{m21}$$

[Equation 3b]

$$Y_{21} = \left[ \begin{array}{c} \pm\sqrt{Y_{d2}-Y_{d1}}\sqrt{Y_{d3}-Y_{d1}} \\ \sqrt{Y_{d3}-Y_{d2}}\sqrt{Y_{m22}-Y_{m21}} \\ \sqrt{Y_{m23}-Y_{m21}}\sqrt{Y_{m23}-Y_{m22}} \end{array} - \left\{ \begin{array}{c} (Y_{d3}-Y_{d2})Y_{m22}Y_{m23}+ \\ (Y_{d1}-Y_{d3})Y_{m21}Y_{m23}+ \\ (Y_{d2}-Y_{d1})Y_{m21}Y_{m22} \end{array} \right\} \right] / denom$$

$$Y_{22} = \pm\sqrt{\frac{(Y_{d2}-Y_{d1})(Y_{d3}^2 + (-Y_{d2}-Y_{d1})Y_{d3} + Y_{d1}Y_{d2})}{(Y_{m22}-Y_{m21})(Y_{m23}^2 + (-Y_{m22}-Y_{m21})Y_{m23} + Y_{m21}Y_{m22})}} / denom$$

using results $Y_{d1}$, $Y_{d2}$, and $Y_{d3}$ obtained by measuring admittance of the at least three first correction data acquisition samples at the first step, and results $Y_{m11}$, $Y_{m12}$, and $Y_{m13}$ obtained by measuring admittance of the terminal $1_m$ and results $Y_{m21}$, $Y_{m22}$, and $Y_{m23}$ obtained by measuring admittance of the terminal $2_m$ regarding the at least three first correction data acquisition samples or the second correction data acquisition samples at the second step.

3. An electronic-component high-frequency characteristic error correcting method for calculating, on the basis of a result obtained by measuring a two-terminal impedance electronic component by an actual measuring system, an estimated frequency characteristic value of the electronic component obtained when the electronic component is measured by a reference measuring system, the method comprising:

a first step of preparing at least three first correction data acquisition samples having different frequency characteristics, values of the at least three first correction data acquisition samples being identified by the reference measuring system;

a second step of measuring the at least three first correction data acquisition samples or at least three second correction data acquisition samples that have frequency characteristics equivalent to the at least three first correction data acquisition samples by the actual measuring system;

a third step of determining an equation that associates an actual value measured by the actual measuring system with a reference value measured by the reference measuring system using an error correction coefficient of a transmission line on the basis of the values of the first correction data acquisition samples prepared at the first step and the values of the first correction data acquisition samples or the second correction data acquisition samples measured by the actual measuring system at the second step;

a fourth step of measuring a given electronic component by the actual measuring system;

a fifth step of calculating, using the equation determined at the third step, an estimated frequency characteristic value of the electronic component obtained when the electronic component is measured by the reference measuring system on the basis of the measured result obtained at the fourth step, wherein the first correction data acquisition sample and the electronic component or the first correction data acquisition sample, the second correction data acquisition sample, and the electronic component are series-connected in the actual measuring system, and wherein the third step includes a sub step of converting the values of the at least three first correction data acquisition samples having the different frequency characteristics, prepared at the first step, identified by the reference measuring system and the measured values of the at least three first correction data acquisition samples having different frequency characteristics or the at least three second correction data acquisition samples that have frequency characteristics equivalent to the first correction data acquisition samples obtained in the actual measuring system at the second step into impedance parameters and determining a differential impedance component, and wherein the equation associates impedance obtained when the electronic component is measured using two ports of the actual measuring system with impedance obtained when the electronic component is measured in the reference measuring system through a two-port error model, and the equation is determined on the basis of a one-port error model having only one port, to which a differential signal of the two ports is input and where impedance of the electronic component is measured by the reference measuring system.

4. An electronic-component high-frequency characteristic error correcting method for calculating, on the basis of a result obtained by measuring a two-terminal impedance electronic component by an actual measuring system, an estimated frequency characteristic value of the electronic component obtained when the electronic component is measured by a reference measuring system, the method comprising:

a first step of preparing at least three first correction data acquisition samples having different frequency characteristics, values of the at least three first correction data acquisition samples being identified by the reference measuring system;

a second step of measuring the at least three first correction data acquisition samples or at least three second correction data acquisition samples that have frequency characteristics equivalent to the at least three first correction data acquisition samples by the actual measuring system;

a third step of determining an equation that associates an actual value measured by the actual measuring system with a reference value measured by the reference measuring system using an error correction coefficient of a transmission line on the basis of the values of the first correction data acquisition samples prepared at the first step and the values of the first correction data acquisition samples or the second correction data acquisition samples measured by the actual measuring system at the second step;

a fourth step of measuring a given electronic component by the actual measuring system;

a fifth step of calculating, using the equation determined at the third step, an estimated frequency characteristic value of the electronic component obtained when the electronic component is measured by the reference measuring system on the basis of the measured result obtained at the fourth step, wherein the first correction data acquisition sample and the electronic component or the first correction data acquisition sample, the second correction data acquisition sample, and the electronic component are shunt-connected in the actual measuring system, and wherein the third step includes a sub step of converting the values of the at least three first correction data acquisition samples having the different frequency characteristics, prepared at the first step, identified by the reference measuring system and the measured values of the at least three first correction data acquisition samples having different frequency characteristics or the at least three second correction data acquisition samples that have frequency characteristics equivalent to the first correction data acquisition samples obtained in the actual measuring system at the second step into admittance parameters and determining a common-mode admittance component, and wherein the equation associates admittance obtained when the electronic component is measured using two ports of the actual measuring system with admittance obtained when the electronic component is measured in the reference measuring system through a two-port error model, and the equation is determined on the basis of a one-port error model having only one port, to which a common-mode signal of the two ports is input and where admittance of the electronic component is measured by the reference measuring system.

5. An electronic-component high-frequency characteristic error correcting apparatus used in at least the fifth step of the electronic-component frequency characteristic error correcting method according to claim 1, the apparatus comprising:

a storage unit for storing the equation determined at the third step and a measured value of a given electronic component obtained in the actual measuring system at the fourth step; and a calculating unit for performing calculation for correcting the measured value stored in the storage unit using the equation stored in the storage unit and calculating an estimated frequency characteristic value of the electronic component obtained when the electronic component is measured by the reference measuring system.

6. An electronic-component high-frequency characteristic error correcting apparatus used in at least the fifth step of the electronic-component frequency characteristic error correcting method according to claim 2, the apparatus comprising:

a storage unit for storing the equation determined at the third step and a measured value of a given electronic component obtained in the actual measuring system at the fourth step; and a calculating unit for performing calculation for correcting the measured value stored in the storage unit using the equation stored in the storage unit and calculating an estimated frequency characteristic value of the electronic component obtained when the electronic component is measured by the reference measuring system.

7. An electronic-component high-frequency characteristic error correcting apparatus used in at least the fifth step of the electronic-component frequency characteristic error correcting method according to claim 3, the apparatus comprising:

a storage unit for storing the equation determined at the third step and a measured value of a given electronic component obtained in the actual measuring system at the fourth step; and a calculating unit for performing calculation for correcting the measured value stored in the storage unit using the equation stored in the storage unit and calculating an estimated frequency characteristic value of the electronic component obtained when the electronic component is measured by the reference measuring system.

8. An electronic-component high-frequency characteristic error correcting apparatus used in at least the fifth step of the electronic-component frequency characteristic error correcting method according to claim 4, the apparatus comprising:

a storage unit for storing the equation determined at the third step and a measured value of a given electronic component obtained in the actual measuring system at the fourth step; and a calculating unit for performing calculation for correcting the measured value stored in the storage unit using the equation stored in the storage unit and calculating an estimated frequency characteristic value of the electronic component obtained when the electronic component is measured by the reference measuring system.

* * * * *